(12) United States Patent
Sako et al.

(10) Patent No.: US 9,804,208 B2
(45) Date of Patent: Oct. 31, 2017

(54) POWER RECEIVING DEVICE THAT DETERMINES CHARGEABLE POWER

(71) Applicant: Sony Corporation, Tokyo (JP)

(72) Inventors: Yoichiro Sako, Tokyo (JP); Takanori Washiro, Kanagawa (JP); Kazuyoshi Takemura, Tokyo (JP); Kuniya Hayashi, Tokyo (JP); Isao Soma, Saitama (JP); Kayoko Tanaka, Tokyo (JP); Satoshi Higano, Kanagawa (JP); Kazutoshi Serita, Tokyo (JP)

(73) Assignee: SONY CORPORATION, Tokyo (JP)

( * ) Notice: Subject to any disclaimer, the term of this patent is extended or adjusted under 35 U.S.C. 154(b) by 212 days.

(21) Appl. No.: 14/376,157

(22) PCT Filed: Dec. 11, 2012

(86) PCT No.: PCT/JP2012/082050
§ 371 (c)(1),
(2) Date: Aug. 1, 2014

(87) PCT Pub. No.: WO2013/118385
PCT Pub. Date: Aug. 15, 2013

(65) Prior Publication Data
US 2015/0022185 A1    Jan. 22, 2015

(30) Foreign Application Priority Data

Feb. 10, 2012  (JP) ................................ 2012-027486

(51) Int. Cl.
*G01R 19/14*     (2006.01)
*G01R 21/00*     (2006.01)
(Continued)

(52) U.S. Cl.
CPC .......... *G01R 21/00* (2013.01); *B60L 11/1816* (2013.01); *B60L 11/1824* (2013.01);
(Continued)

(58) Field of Classification Search
CPC .......... H02J 7/007; H02J 7/025; H02J 7/0052; H02J 7/0021; H02J 7/0044; H02J 7/0054; H02J 7/0029; H02J 7/0063; H02J 13/00; H02J 7/0014; H02J 7/0081; H02J 7/0086; H02J 7/02; H02J 7/045; H02J 7/0036; H02J 7/0047; H02J 7/0057; H02J 7/0077; H02J 7/041; H02J 7/042; H02J 7/085;
(Continued)

(56) References Cited

U.S. PATENT DOCUMENTS 4,193,129 A * 3/1980 Wiggins .................. G01S 7/521
                                                    320/137
4,701,698 A * 10/1987 Karlsson .............. G01R 21/133
                                                    324/103 R
(Continued)

*Primary Examiner* — Vinh Nguyen
(74) *Attorney, Agent, or Firm* — Chip Law Group

(57) ABSTRACT

There is provided a power receiving device including a connecting unit that is connected to a power line through which power is transmitted, a determining unit that determines whether transmitted power is chargeable, based on power identification information indicating whether the transmitted power is chargeable power, and a notification control unit that performs notification based on a determination result.

6 Claims, 12 Drawing Sheets

(51) Int. Cl.
*H02J 13/00* (2006.01)
*H04B 3/54* (2006.01)
*H02J 7/00* (2006.01)
*B60L 11/18* (2006.01)
*G01R 21/133* (2006.01)

(52) U.S. Cl.
CPC ....... *B60L 11/1838* (2013.01); *B60L 11/1846* (2013.01); *B60L 11/1848* (2013.01); *G01R 21/1333* (2013.01); *H02J 7/00* (2013.01); *H02J 13/0058* (2013.01); *H02J 13/0093* (2013.01); *H04B 3/54* (2013.01); *B60L 2230/12* (2013.01); *H02J 2007/0001* (2013.01); *H02J 2007/0098* (2013.01); *Y02T 10/7005* (2013.01); *Y02T 10/7088* (2013.01); *Y02T 90/121* (2013.01); *Y02T 90/128* (2013.01); *Y02T 90/14* (2013.01); *Y02T 90/163* (2013.01); *Y02T 90/168* (2013.01); *Y02T 90/169* (2013.01); *Y04S 30/12* (2013.01); *Y04S 30/14* (2013.01)

(58) Field of Classification Search
CPC ............ G01R 31/3679; G01R 31/3606; G01R 31/3648; G01R 19/0084; G01R 19/15; G01R 19/16528; G01R 31/362; G01R 31/3634; G01R 3/3658; G01R 35/00; G01R 31/36; G05B 19/042; G05B 2219/2639; H02P 23/0036; H02P 23/14; H04B 10/808; H04B 2203/5445; H04B 2203/5483; H04B 3/56; H04B 5/02; H04B 17/309; H04B 1/18; H04B 1/48; H04B 1/525; H04B 2203/5454; H04B 2203/5491; G06F 19/00; G06F 1/266; G01L 19/12; G01L 27/007; G01L 9/00; G06Q 30/02

See application file for complete search history.

(56) References Cited

U.S. PATENT DOCUMENTS

| | | | | |
|---|---|---|---|---|
| 7,772,850 | B2* | 8/2010 | Bertness | G01R 31/3648 320/136 |
| 7,996,165 | B2* | 8/2011 | Keuss | G01R 31/3631 320/149 |
| 2004/0078153 | A1* | 4/2004 | Bartone | H02J 3/14 702/57 |
| 2010/0094737 | A1* | 4/2010 | Lambird | G06Q 30/04 705/34 |
| 2010/0211643 | A1* | 8/2010 | Lowenthal | B60L 3/0069 709/206 |
| 2011/0074342 | A1* | 3/2011 | MacLaughlin | H02J 7/025 320/108 |
| 2014/0333128 | A1* | 11/2014 | Ichikawa | H02J 7/025 307/9.1 |
| 2014/0375138 | A1* | 12/2014 | Sako | B60L 11/1816 307/104 |

* cited by examiner

POWER RECEIVING DEVICE THAT DETERMINES CHARGEABLE POWER

TECHNICAL FIELD

The present disclosure relates to a power receiving device and a program.

BACKGROUND ART

Recently, there has appeared a device that can authenticate a power supply target device such as, for example, a power supply device for a vehicle such as an electric vehicle (EV), and selectively supply power to the power supply target device according to the authentication result. In addition, there has been developed a technology that performs authentication or charging processing using power line communication. An example of the technology that performs authentication or charging processing using power line communication is disclosed in Patent Literature 1.

CITATION LIST

Patent Literature

Patent Literature 1: JP 2006-262570A

SUMMARY OF INVENTION

Technical Problem

When a power receiving side device (hereinafter, referred to as "power receiving device") receives power, for example, a user connects the power receiving device to an outlet or the like that can connect the power receiving device and a power line. However, in the above case, the user may not identify whether power transmitted from the connected power line is chargeable power.

The present disclosure provides a new and improved power receiving device and program that can notify a user whether transmitted power is chargeable power.

Solution to Problem

According to the present disclosure, there is provided a power receiving device including a connecting unit that is connected to a power line through which power is transmitted, a determining unit that determines whether transmitted power is chargeable, based on power identification information indicating whether the transmitted power is chargeable power, and a notification control unit that performs notification based on a determination result.

According to the present disclosure, there is provided a program for causing a computer to execute a step of determining whether power transmitted through a power line is chargeable, based on power identification information indicating whether the transmitted power is chargeable power, and a step of performing notification based on a determination result.

Advantageous Effects of Invention

According to the present disclosure, it is possible to notify a user whether transmitted power is chargeable power.

DESCRIPTION OF EMBODIMENTS

Figure 1:
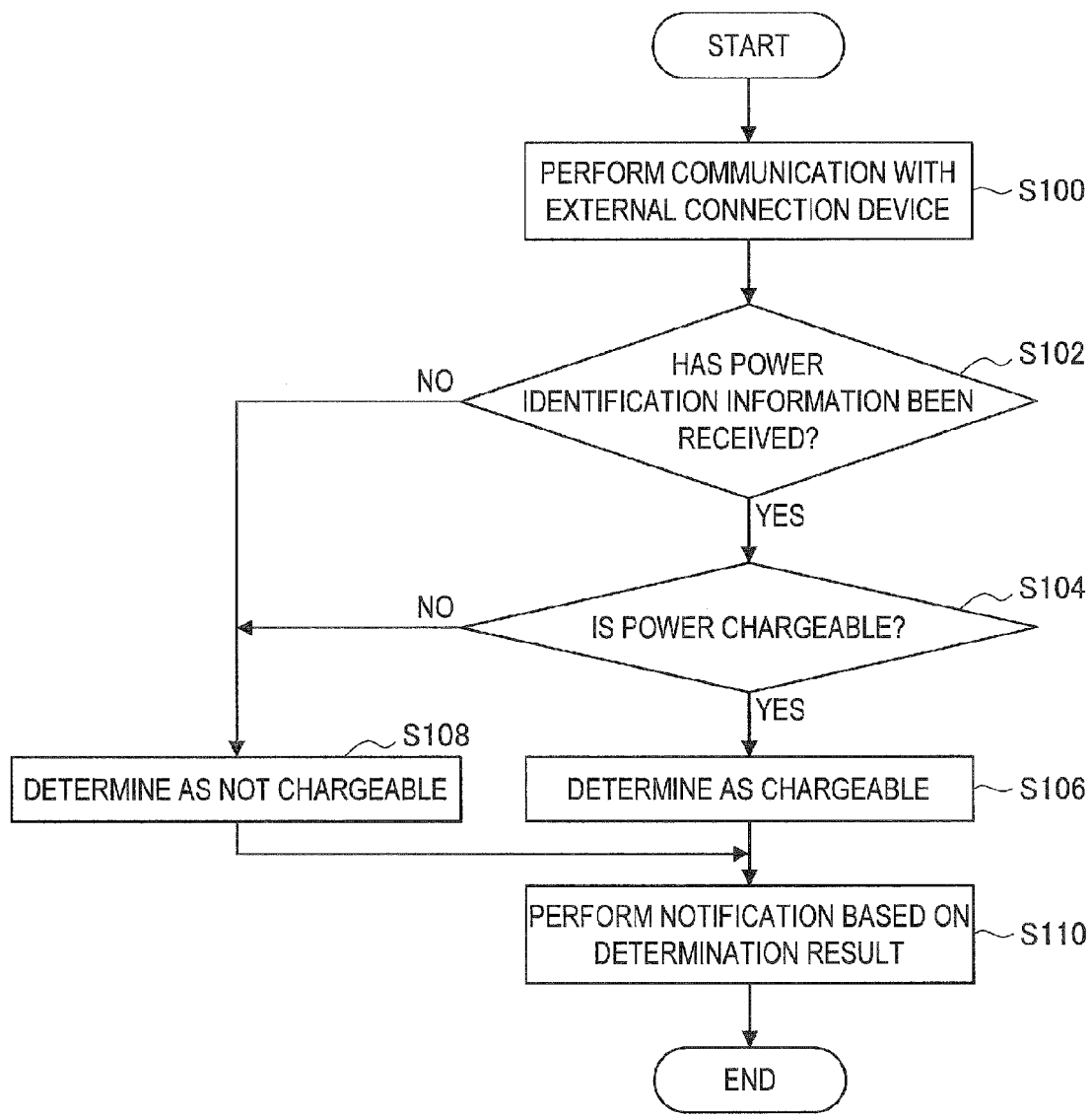
FIG. 1 is a flowchart illustrating a first example of processing related to a notification control method in a power receiving device according to the present embodiment.

Hereinafter, preferred embodiments of the present disclosure will be described in detail with reference to the appended drawings. Note that, in this specification and the drawings, elements that have substantially the same function and structure are denoted with the same reference signs, and repeated explanation is omitted.

The description will be provided in the order shown below.

1. Notification Control Method According to Present Embodiment
2. Communication According to Present Embodiment
3. Power Receiving Device According to Present Embodiment
4. Program According to Present Embodiment (Notification Control Method According to Present Embodiment)

Before describing a configuration of a power receiving device according to the present embodiment, a notification control method according to the present embodiment will be first described.

As described above, for example, even when the user connects the power receiving device to the outlet or the like, the user may not identify whether power transmitted from the power line, to which the power receiving device is connected, is chargeable power.

Therefore, the power receiving device according to the present embodiment determines whether the transmitted power is chargeable, and notifies the user of the determination result. More specifically, the power receiving device according to the present embodiment performs, for example, processing (1) (determination processing) and processing (2) (notification control processing) mentioned below, and notifies the user of the determination result of whether the transmitted power is chargeable.

(1) Determination Processing

The power receiving device according to the present embodiment, for example, determines whether the transmitted power is chargeable, based on power identification information indicating that the power transmitted from the power line connected to the power receiving device according to the present embodiment is chargeable power.

(1-1) First Determination Processing

The power receiving device according to the present embodiment, for example, performs communication with an external device connected through the power line by wire (the external device corresponds to a power supply device that transmits power, when viewed from the power receiving device according to the present embodiment. Hereinafter, the external device may also be referred to as an "external connection device"), and determines whether the transmitted power is chargeable, based on power identification information transmitted from the external connection device. Here, examples of the power identification information according to the present embodiment include data indicating whether the transmitted power is chargeable power (for example, whether the transmitted power is chargeable or free of charge). Further, the power identification information according to the present embodiment is not limited to the above example. For example, when the transmitted power is chargeable power, data indicating the price of power (for example, unit price such as the price per [kW]) may further be included in the power identification information according to the present embodiment.

For example, when the power identification information is received and the received power identification information indicates that the transmitted power is chargeable power, the power receiving device according to the present embodiment determines that the transmitted power is chargeable. For example, when the power identification information is not received, or when the received power identification information does not indicate that the transmitted power is chargeable power, the power receiving device according to the present embodiment does not determine that the transmitted power is chargeable.

Communication between the power receiving device of the present embodiment and the external connection device of the present embodiment will be described later.

(1-2) Second Determination Processing

The determination processing in the power receiving device according to the present embodiment is not limited to the first determination processing. For example, the power receiving device according to the present embodiment can perform determination based on power identification information included in transmitted power. The power receiving device according to the present embodiment, for example, receives packetized power identification information transmitted through the power line, and determines whether the transmitted power is chargeable, based on the received power identification information.

For example, when the packetized power identification information is received and the received power identification information indicates that the transmitted power is chargeable power, the power receiving device according to the present embodiment determines that the transmitted power is chargeable. For example, when the power identification information is not received, or when the received power identification information does not indicate that the transmitted power is chargeable power, the power receiving device according to the present embodiment does not determine that the transmitted power is chargeable.

The power receiving device according to the present embodiment, for example, performs the first determination processing and/or the second determination processing to determine whether the transmitted power is chargeable.

(2) Notification Control Processing

The power receiving device according to the present embodiment, for example, causes the notifying unit (which will be described later) arranged therein to perform notification based on the determination result of the processing (1) (determination processing), and/or causes the external device to perform notification based on the determination result.

Examples of the notifying method according to the present embodiment include a method appealing to a sense of a user, such as a visually notifying method using a text or an image, or a lighting of a lamp, an auditorily notifying method using voices (including a music or a beep sound, the same hereinafter), or the like. More specifically, examples of the notifying method according to the present embodiment include a lighting of a lamp corresponding to notification content among lamps of multiple colors corresponding to respective notification content, or a changing of a lamp flashing method according to notification content (example of the visually notifying method). Examples of the notifying method according to the present embodiment include a reproduction of a voice corresponding to notification content among voices corresponding to respective notification content (example of the auditorily notifying method).

Here, the power receiving device according to the present embodiment performs different notifications, for example, when the transmitted power is determined as chargeable and when the transmitted power is not determined as chargeable, as the notification based on the determination result of the processing (1) (determination processing). As the different notifications according to the present embodiment, for example, the power receiving device according to the present embodiment performs different notifications when the transmitted power is determined as chargeable and when the transmitted power is not determined as chargeable. For example, when the transmitted power is determined as chargeable, the power receiving device according to the present embodiment notifies a warning to the effect that the transmitted power is chargeable (for example, to the effect that the power is to be charged). When the transmitted power is not determined as chargeable, for example, the power receiving device according to the present embodiment performs notification to the effect that the transmitted power is not chargeable (for example, to the effect that the power is free of charge).

The different notification according to the present embodiment is not limited to the above examples. As the different notifications according to the present embodiment, for example, the power receiving device according to the present embodiment performs notifications either when the transmitted power is determined as chargeable or when the transmitted power is not determined as chargeable.

The notification performed by the power receiving device according to the present embodiment is not limited to the above examples. For example, when the transmitted power is determined as chargeable, the power receiving device according to the present embodiment may further notify the price of power, in addition to the warning to the effect that the transmitted power is chargeable (for example, to the effect that the power is to be charged). More specifically, when data indicating the price of power is included in the received power identification information, for example, the power receiving device according to the present embodiment can notify the price based on the data indicating the price of power.

The power receiving device according to the present embodiment performs the processing (2) (notification control processing) to perform notification based on the determination result of the processing (1) (determination processing). Therefore, the power receiving device according to the present embodiment can perform the processing (2) (notification control processing) to notify the user whether the transmitted power is chargeable.

The power receiving device according to the present embodiment performs, for example, the processing (1) (determination processing) and the processing (2) (notification control processing) as the processing related to the notification control method according to the present embodiment. Here, the power receiving device according to the present embodiment determines whether the transmitted power is chargeable in the processing (1) (determination processing), and notifies the user of the determination result of the processing (1) (determination processing) in the processing (2) (notification control processing).

Therefore, the power receiving device according to the present embodiment can notify the user whether the transmitted power is chargeable.

Since the power receiving device according to the present embodiment notifies the user whether the transmitted power is chargeable, the user can recognize whether the power transmitted to the power receiving device is chargeable power. Therefore, the power receiving device according to the present embodiment can improve user convenience.

The processing related to the notification control method in the power receiving device according to the present embodiment is not limited to the above examples. For example, when the transmitted power is determined as chargeable, the power receiving device according to the present embodiment may notify a warning to the effect that the transmitted power is chargeable (for example, to the effect that the power is to be charged) and may also perform charging-related confirmation, such as whether to perform charging, to the user of the power receiving device of the present embodiment. Here, as the charging-related confirmation performed to the user by the power receiving device of the present embodiment, for example, the power receiving device of the present embodiment displays an interface that can allow the user to select whether to perform charging (example of a visual confirmation). In addition, the power receiving device according to the present invention, for example, may perform the charging-related confirmation by voices (example of an auditory confirmation).

In addition, for example, when the input of the user to the interface that can allow the user to select whether to perform the charging or the input (for example, voice input or the like) from the user for the charging-related confirmation by the voices indicates that the user is to perform the charging, the power receiving device according to the present embodiment may perform the charging and also transmit the power. The power receiving device according to the present embodiment, for example, performs communication with an external device (for example, a power supply device according to the present embodiment), such as a device that performs the charging-related processing or a device that transmits power, and performs processing in conjunction with the external device to control the charging and the power transmission.

FIG. 1 is a flowchart illustrating a first example of processing related to the notification control method in the power receiving device according to the present embodiment. Here, processing of steps S100 to S108 illustrated in FIG. 1 corresponds to the first determination processing in the processing (1) (determination processing), and processing of step S110 illustrated in FIG. 1 corresponds to the processing (2) (notification control processing).

The power receiving device according to the present embodiment performs communication with the external connection device (S100). The power receiving device according to the present embodiment determines whether power identification information has been received through the communication with the external connection device (S102).

When it is determined in step S102 that the power identification information has been received, the power receiving device according to the present embodiment determines whether transmitted power is chargeable, based on the received power identification information (S104). Here, for example, when the received power identification information indicates that the transmitted power is chargeable power, the power receiving device according to the present embodiment determines that the transmitted power is chargeable.

When it is determined in step S104 that the transmitted power is chargeable, the power receiving device according to the present embodiment determines that the transmitted power is chargeable (S106). In addition, when it is not determined in step S104 that the transmitted power is chargeable, the power receiving device according to the present embodiment performs processing of step S108 which will be described later.

When it is not determined in step S102 that the power identification information has been received, or when it is not determined in step S104 that the transmitted power is chargeable, the power receiving device according to the present embodiment does not determine that the transmitted power is chargeable (S108).

The power receiving device according to the present embodiment, for example, causes the notifying unit (which will be described later) arranged therein and/or the external device to perform notification based on the determination result of step S106 or step S108 (S110).

The power receiving device according to the present embodiment performs, for example, the processing illustrated in FIG. 1 as the processing related to the notification control method. For example, by performing the processing illustrated in FIG. 1, the first determination processing and the processing (2) (notification control processing) according to the present embodiment are realized. The processing related to the notification control method in the power receiving device according to the present embodiment is not limited to the processing illustrated in FIG. 1.

Figure 2:
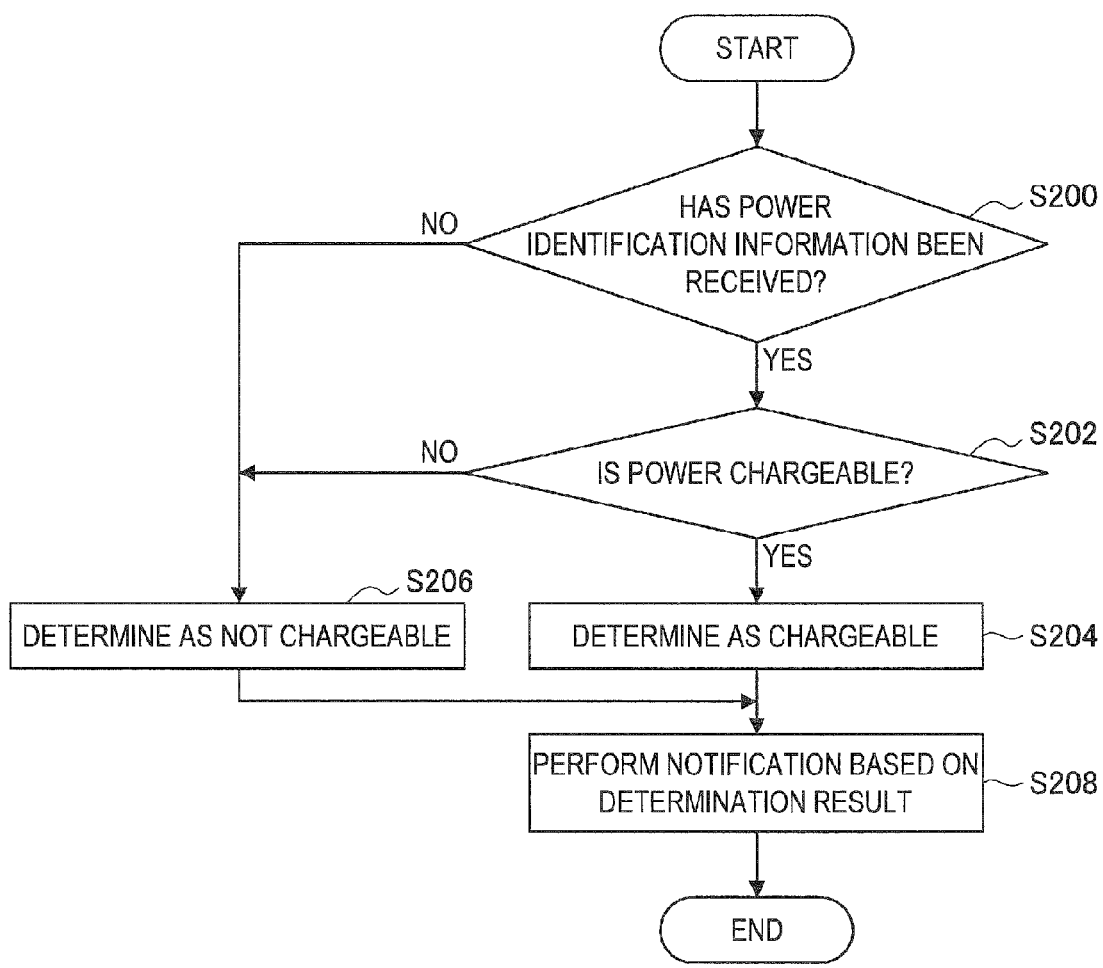
FIG. 2 is a flowchart illustrating a second example of processing related to a notification control method in a power receiving device according to the present embodiment.

FIG. 2 is a flowchart illustrating a second example of processing related to the notification control method in the power receiving device according to the present embodiment. Here, processing of steps S200 to S206 illustrated in FIG. 2 corresponds to the second determination processing in the processing (1) (determination processing), and processing of step S208 illustrated in FIG. 2 corresponds to the processing (2) (notification control processing).

The power receiving device according to the present embodiment, for example, determines whether the packetized power identification information has been received (detected) (S200).

When it is determined in step S200 that the power identification information has been received, the power receiving device according to the present embodiment determines whether the transmitted power is chargeable, based on the received power identification information, just like the processing of step S104 of FIG. 1 (S202).

When it is determined in step S202 that the transmitted power is chargeable, the power receiving device according to the present embodiment determines that the transmitted power is chargeable (S204). In addition, when it is not determined in step S202 that the transmitted power is chargeable, the power receiving device according to the present embodiment performs processing of step S206 which will be described later.

When it is not determined in step S200 that the power identification information has been received, or when it is not determined in step S202 that the transmitted power is chargeable, the power receiving device according to the present embodiment does not determine that the transmitted power is chargeable (S206).

The power receiving device according to the present embodiment, for example, causes the notifying unit (which will be described later) arranged therein and/or the external device to perform notification based on the determination result of step S204 or step S206 (S208).

The power receiving device according to the present embodiment performs, for example, the processing illustrated in FIG. 2 as the processing related to the notification control method. For example, by performing the processing illustrated in FIG. 2, the second determination processing and the processing (2) (notification control processing) according to the present embodiment are realized.

The processing related to the notification control method in the power receiving device according to the present embodiment is not limited to the processing illustrated in FIG. 1 and the processing illustrated in FIG. 2. For example, in the processing of step S102 illustrated in FIG. 1, the power receiving device according to the present embodiment may determine whether the power identification information has been received, based on the power identification information received through the communication with the external connection device or the packetized power identification information received through the power line. That is, the power receiving device according to the present embodiment, for example, can perform one of the first determination processing and the second determination processing to determine whether the transmitted power is chargeable, and notify the user whether the transmitted power is chargeable.

(Communication According to Present Embodiment)

Next, regarding the above-described first determination processing in the power receiving device according to the present embodiment, communication performed between the power receiving device according to the present embodiment and the external connection device according to the present embodiment will be described. In the following, the external connection device performing communication with the power receiving device according to the present embodiment may also be referred to as a "power supply device".

Examples of the communication performed between the power receiving device according to the present embodiment and the power supply device (external connection device) according to the present embodiment include a wireless communication and a power line communication (wired communication).

For example, wireless communication is performed between the power receiving device according to the present embodiment and the power supply device according to the present embodiment using a wireless communication technique such as a communication technique by a Near Field Communication (NFC) or Radio Frequency Identification (RFID) technique. Further, power line communication is performed between the power receiving device according to the present embodiment and the power supply device according to the present embodiment, for example, such that the wireless communication technique such as the communication technique by the NFC or RFID technique is applied to wired communication. Here, examples of the power line communication of the present embodiment include communication (so-called contact communication) performed between terminal of devices coming in contact with each other and communication performed when terminals of devices are connected to each other in a wired manner.

For example, the power supply device according to the present embodiment includes a high-frequency signal generating unit (which will be described later) that generates a high-frequency signal, and transmits the high-frequency signal to the external connection device. In other words, the power supply device according to the present embodiment has, for example, a so-called reader/writer function.

Further, the power receiving device according to the present embodiment, for example, performs communication with the external device by performing load modulation based on a signal transmitted from the external device such as the power supply device according to the present embodiment. For example, when the power receiving device according to the present embodiment receives the high-frequency signal transmitted from the power supply device according to the present embodiment, the power receiving device is driven by power obtained from the received high-frequency signal, performs the load modulation based on a result of processing the received high-frequency signal, and thus transmits the high-frequency signal.

For example, as the power receiving device according to the present embodiment and the power supply device according to the present embodiment perform the above-described processes, respectively, the wireless communication according to the present embodiment or the power line communication of the present embodiment is implemented between the power receiving device according to the present embodiment and the power supply device according to the present embodiment.

Here, examples of the high-frequency signal according to the present embodiment include a frequency signal used in RFID and a frequency signal used in non-contact communication. Examples of the frequency of the high-frequency signal include 130 to 135 [kHz], 13.56 [MHz], 56 [MHz], 433 [MHz], 954.2 [MHz], 954.8 [MHz], 2441.75 [MHz], and 2448.875 [MHz], but the frequency of the high-frequency signal according to the present embodiment is not limited to the above examples. In the following, a high frequency transmitted based on the high-frequency signal according to the present embodiment may be referred to as a "carrier wave."

The wireless communication according to the present embodiment and the power line communication of the present embodiment are not limited to the communication using the wireless communication technique such as the communication technique by the NFC or the RFID technique. For example, a wireless communication of an arbitrary scheme such as wireless communication based on IEEE802.11b or power line communication such as PLC (Power Line Communication or power line carrier communication) may be performed between the power supply device according to the present embodiment and the power receiving device according to the present embodiment. In the following, the communication according to the present embodiment will be described in connection with an example in which communication using the wireless communication technique such as the communication technique by the NFC or RFID technique is performed between the power supply device according to the present embodiment and the power receiving device according to the present embodiment.

1. Wireless Communication According to Present Embodiment

Figure 3:
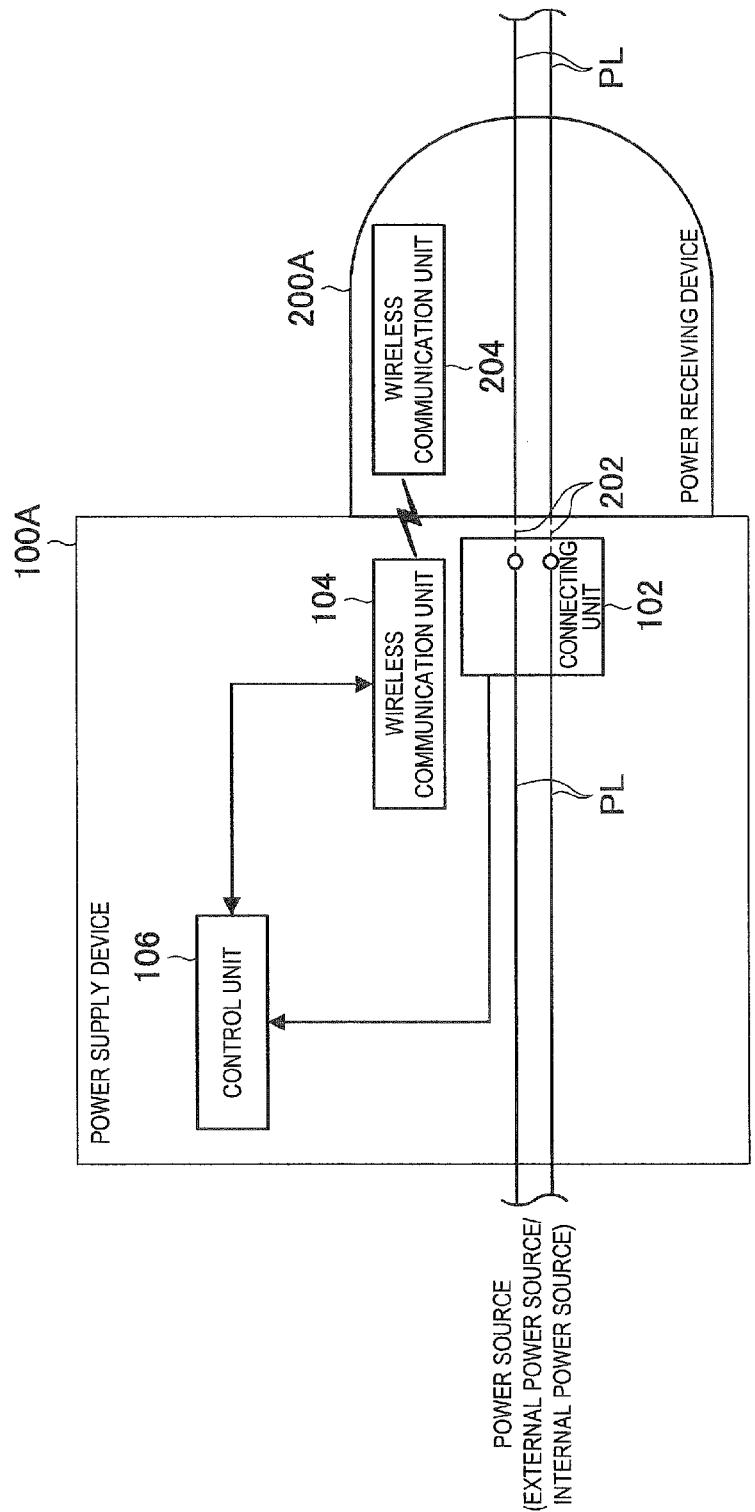
FIG. 3 is an explanatory diagram for describing an example of wireless communication according to the present embodiment.

First, the wireless communication according to the present embodiment will be described. FIG. 3 is an explanatory diagram for describing an example of the wireless communication according to the present embodiment. In the following, the wireless communication according to the present embodiment will be described using a power supply device 100A and a power receiving device 200A illustrated in FIG. 3 as an example. In addition, FIG. 3 illustrates structural elements related to the wireless communication according to the present embodiment in a configuration of the power supply device according to the present embodiment and a configuration of the power receiving device according to the present embodiment. Further, FIG. 3 illustrates a plug as the power receiving device 200A, but the power receiving device according to the present embodiment is not limited to the plug.

For example, the power supply device 100A includes a connecting unit 102, a wireless communication unit 104, and a control unit 106. Further, for example, the power receiving device 200A includes a connecting unit 202 and a wireless communication unit 204.

The connecting unit 102 connects a power line PL through which power is transmitted to an external device. Further, the connecting unit 102 may include a connection supporting member that supports the maintenance of a connection state of the connected external device. Here, a power line through which an alternating current (AC) having a predetermined frequency such as 50 [Hz] or 60 [Hz] or a direct current (DC) flows may be used as the power line PL according to the present embodiment. Further, for example, a magnet may be used as the connection supporting member according to the present embodiment. In the following, the description will proceed in connection with an example in which an AC current having a predetermined frequency flows through the power line PL.

More specifically, the connecting unit 102 has a terminal connected to the power line PL, and the connecting unit 202 has a terminal connected to the power line PL (which corresponds to an external power line when seen from the power supply device 100A). Further, when the terminal of the connecting unit 102 is electrically connected to the terminal of the connecting unit 202, the power supply device 100A is connected to the power receiving device 200A (which corresponds to an external device when seen from the power supply device 100A). Here, an "electrical connection between the terminal of the connecting unit 102 and the terminal of the connecting unit 202" according to the present embodiment refers to, for example, a contact between the connecting units of the devices or a wired connection between the connecting units of the devices. In addition, the connecting unit 202 may include a connection supporting member that supports the maintenance of a connection state of the connected external device, similarly to the connecting unit 102 of the power supply device 100A.

For example, the connecting unit 102 detects a change in the connection state of the external device (a change from the non-connection state to the connection state or a change from the connection state to the non-connection state). Then, the connecting unit 102 transfers a detection signal representing the detection (detection result) to the control unit 106. In addition, when the wireless communication unit 104 has a function of transmitting the high-frequency signal in response to the transfer of the detection signal, the connecting unit 102 may transfer the detection signal to the wireless communication unit 104.

Here, for example, the connecting unit 102 includes a switch of detecting a physical connection state of the external device, and transfers the detection signal to the control unit 106 when a state of the switch changes. However, a configuration of the connecting unit 102 is not limited to this example. In addition, when the power supply device 100A is configured to transmit the high-frequency signal at regular intervals or irregular intervals, for example, the connecting unit 102 according to the present embodiment may be configured not to have a function of detecting a change in the connection state of the external device.

The wireless communication unit 104 and the wireless communication unit 204 undertake the wireless communication according to the present embodiment. Further, for example, the communication in the wireless communication unit 104 is controlled by the control unit 106.

The control unit 106 is constituted by a Micro Processing Unit (MPU) or an integrated circuit (IC) in which various kinds of processing circuits are integrated, and controls the components of the power supply device 100A. More specifically, for example, the control unit 106 transfers a high-frequency signal generation command or a high-frequency signal transmission stop command to a power line communication unit 108 based on the detection signal transferred from the connecting unit 102 or a response signal of the external connection device such as a power receiving device 200B transferred from the power line communication unit 108, and controls the communication in the power line communication unit 108.

Figure 4:
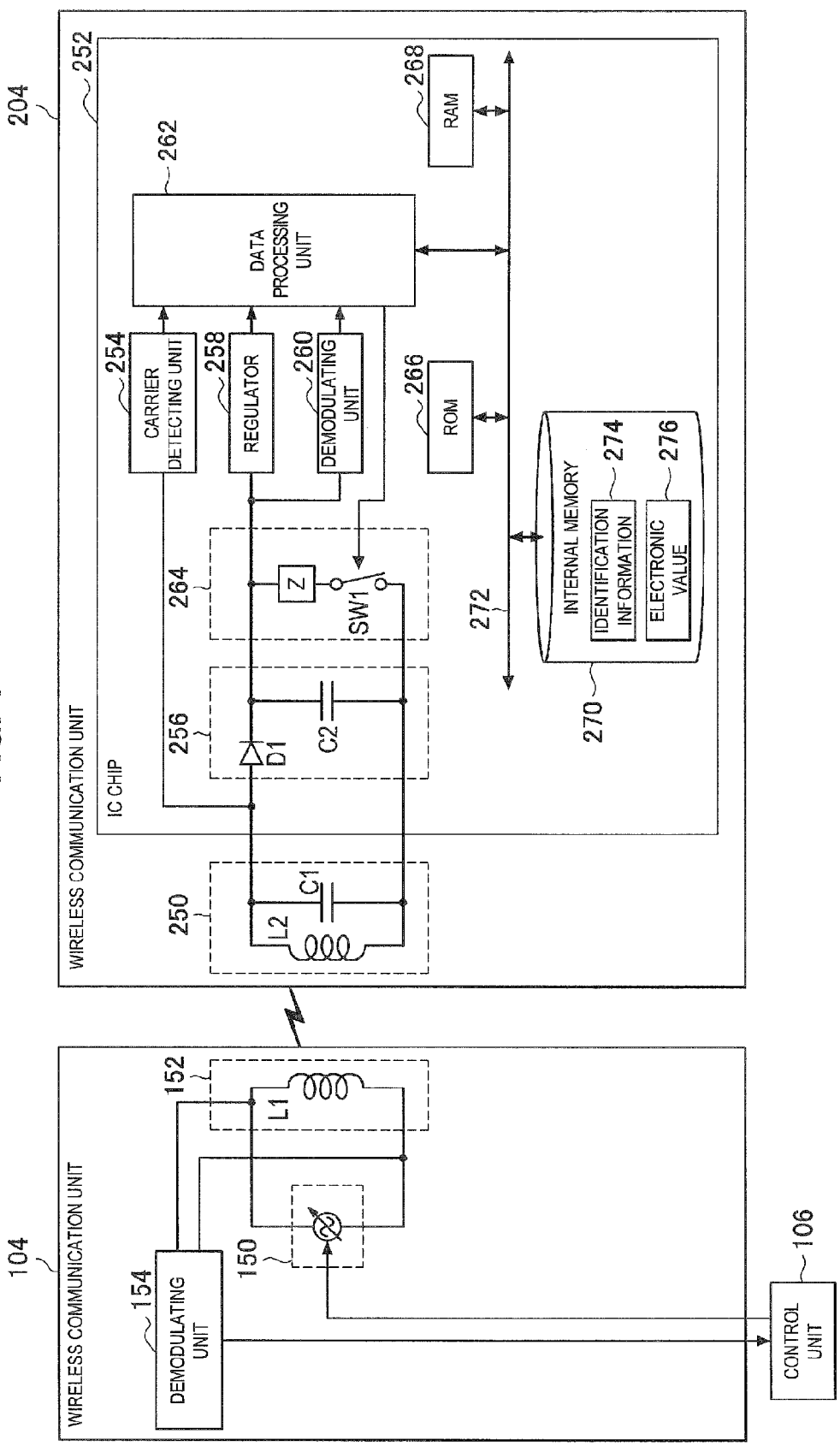
FIG. 4 is an explanatory diagram illustrating an example of a configuration for implementing wireless communication performed between a power receiving device according to the present embodiment and a power supply device according to the present embodiment.

FIG. 4 is an explanatory diagram illustrating an example of a configuration for implementing wireless communication performed between the power supply device according to the present embodiment and the power receiving device according to the present embodiment. Here, FIG. 4 illustrates an example of configurations of the wireless communication unit 104 and the control unit 106 arranged in the power supply device 100A illustrated in FIG. 3 and the wireless communication unit 204 arranged in the power receiving device 200A illustrated in FIG. 3.

1-1. Wireless Communication Unit 104 Arranged in Power Supply Device According to Present Embodiment For example, the wireless communication unit 104 includes a high-frequency signal generating unit 150, a high-frequency transmitting unit 152, and a demodulating unit 154. For example, the wireless communication unit 104 transmits the high-frequency signal in response to the high-frequency signal generation command transferred from the control unit 106, and stops transmission of the high-frequency signal in response to the high-frequency signal transmission stop command transferred from the control unit 106.

The wireless communication unit 104 may include, for example, an encryption circuit (not shown) for encrypting communication, a communication anti-collision circuit, or a connection interface (not shown) for connecting an external device with another circuit. Here, for example, the structural elements of the wireless communication unit 104 are connected to each other via a bus serving as a transmission path of data. Examples of the connection interface include a Universal Asynchronous Receiver Transmitter (UART), a Local Area Network (LAN) terminal, and a transceiving circuit.

The high-frequency signal generating unit 150 receives the high-frequency signal generation command from the control unit 106, and the high-frequency signal corresponding to the high-frequency signal generation command. Here, in FIG. 4, AC power is used as the high-frequency signal generating unit 150, but the high-frequency signal according to the present embodiment generating unit 150 is not limited to this example. For example, the high-frequency signal according to the present embodiment generating unit 150 may include a modulating circuit (not shown) that performs Amplitude Shift Keying (ASK) modulation and an amplifying circuit (not shown) that amplifies an output of the modulating circuit.

Here, for example, a high-frequency signal including the identification information transmission request to request the external connection device to transmit the identification information, or a high-frequency signal including various kinds of processing commands or data to be processed may be used as the high-frequency signal generated by the high-frequency signal generating unit 150. However, the high-frequency signal generated by the high-frequency signal generating unit 150 is not limited to this example. For example, the high-frequency signal according to the present embodiment may be a signal (for example, a non-modulated signal) causing the power line communication unit 208 of the power receiving device 200A to perform power supply.

For example, the high-frequency transmitting unit 152 includes a coil (inductor) L1 having a predetermined inductance, and transmits the carrier wave corresponding to the high-frequency signal generated by the high-frequency signal generating unit 150. Further, the high-frequency transmitting unit 152 can receive the response signal from the external connection device. In other words, the high-frequency transmitting unit 152 can undertake a communication antenna of the wireless communication unit 104. Here, FIG. 4 illustrates the example in which the high-frequency transmitting unit 152 is constituted by the coil L1, but the configuration of the high-frequency transmitting unit 152 according to the present embodiment is not limited to this example. For example, the high-frequency transmitting unit according to the present embodiment may further include a capacitor to configure a resonance circuit.

For example, the demodulating unit 154 demodulates the response signal from the external connection device by performing envelope detection on a change in amplitude of a voltage in an antenna end of the high-frequency transmitting unit 152 and binarizing the detected signal. The demodulating device of the response signal in the demodulating unit 154 is not limited to the above example, and, for example, the demodulating unit 154 can demodulate the response signal using a change in a phase of a voltage in the antenna end of the high-frequency transmitting unit 152.

Further, the demodulating unit 154 transfers the demodulated response signal to the control unit 106. Then, when the demodulated response signal is transmitted to the control unit 106, for example, the control unit 106 performs a variety of processing as processing of processing data corresponding to the response signal and processing of generating the high-frequency signal generation command based on the processing result.

For example, through the configuration illustrated in FIG. 4, the wireless communication unit 104 transmits the carrier wave, and demodulates the response signal transmitted from the external connection device such as the power receiving device 200A. Of course, the configuration of the wireless communication unit 104 according to the present embodiment is not limited to the configuration illustrated in FIG. 4.

1-2. Wireless Communication Unit 204 Arranged in Power Receiving Device According to Present Embodiment The wireless communication unit 204 includes a communication antenna 250 and an IC chip 252. For example, the structural elements of the wireless communication unit 204 are connected to each other via a bus 272 serving as a data transmission path.

The communication antenna 250 receives the carrier wave transmitted from the external connection device such as the power supply device 100A, and transmits the response signal based on a processing result of processing in the IC chip 252.

For example, the communication antenna 250 is constituted by a resonance circuit including a coil (inductor) L2 having a predetermined inductance and a capacitor C1 having a predetermined capacitance, and generates an inductive voltage by electromagnetic induction upon receiving the carrier wave. Then, the communication antenna 250 outputs a reception voltage obtained by resonating the inductive voltage at a predetermined resonance frequency. Here, for example, the resonance frequency in the communication antenna 250 is set according to the frequency of the carrier wave such as 13.56 [MHz]. Through the above-described configuration, the communication antenna 250 receives the carrier wave, and transmits the response signal by load modulation performed in a load modulating unit 264 (which will be described later) arranged in the IC chip 252.

The IC chip 252 demodulates and processes the high-frequency signal based on the received carrier wave, and transmits the response signal through the communication antenna 250 by the load modulation. In other words, the IC chip 252 functions substantially as a wireless communication unit that actively performs wireless communication in the wireless communication unit 204.

For example, the IC chip 252 includes a carrier detecting unit 254, a detecting unit 256, a regulator 258, a demodulating unit 260, a data processing unit 262, a load modulating unit 264, a Read Only Memory (ROM) 266, a Random Access Memory (RAM) 268, and an internal memory 270. The data processing unit 262, the ROM 266, the RAM 268, and the internal memory 270 are connected to one another, for example, via the bus 272 serving as a data transmission path. Although not shown in FIG. 4, for example, the IC chip 252 may further include a protection circuit (not shown) for preventing an overvoltage or an overcurrent from being applied to the data processing unit 262. Here, for example, a clamp circuit constituted by a diode and the like may be used as the protection circuit (not shown).

The carrier detecting unit 254 generates a detection signal of a rectangular shape based on the reception voltage transferred from the communication antenna 250, and transfers the detection signal to the data processing unit 262. For example, the data processing unit 262 uses the transferred detection signal as a processing clock for data processing. Here, the detection signal is based on the reception voltage transferred from the communication antenna 250 and thus synchronized with the frequency of the carrier wave transmitted from the external connection device. Thus, the IC chip 252 includes the carrier detecting unit 254 and thus can perform processing with the external connection device in synchronization with the external connection device.

The detecting unit 256 rectifies the reception voltage output from the communication antenna 250. Here, for example, the detecting unit 256 includes a diode D1 and a capacitor C2.

The regulator 258 converts the reception voltage into a constant voltage through smoothing, and outputs a driving voltage to the data processing unit 262. Here, for example, the regulator 258 uses a DC component of the reception voltage as the driving voltage.

The demodulating unit 260 demodulates the high-frequency signal based on the reception voltage, and outputs data (for example, a binary data signal having a high level and a low level) corresponding to the high-frequency signal included in the carrier wave. Here, for example, the demodulating unit 260 outputs an AC component of the reception voltage as data.

For example, the data processing unit 262 is driven using the driving voltage output from the regulator 258 as a power source, and processes data demodulated in the demodulating unit 260. Here, for example, the data processing unit 262 is constituted by an MPU, various processing circuits, or the like.

Further, the data processing unit 262 selectively generates a control signal used to control the load modulation related to the response to the external connection device according to the processing result. Then, the data processing unit 262 selectively outputs the control signal to the load modulating unit 264.

Further, for example, the data processing unit 262 reads data stored in the internal memory 270 based on a command included in the data demodulated in the demodulating unit 260 and updates the read data.

For example, the load modulating unit 264 includes a load Z and a switch SW1, and performs the load modulation by selectively connecting (validates) the load Z in response to the control signal transferred from the data processing unit 262. Here, for example, the load Z is constituted by a resistor having a predetermined resistance value, but the load Z is not limited to this example. For example, the switch SW1 is constituted by a p-channel type Metal Oxide Semiconductor Field Effect Transistor (MOSFET) or an n-channel type MOSFET, but the switch SW1 is not limited to this example.

The ROM 266 stores a program and control data such as a calculation parameter, which are used by the data processing unit 262. The RAM 268 temporarily stores a program executed by the data processing unit 262, a calculation result, an execution state, and the like.

The internal memory 270 is a storage unit arranged in the IC chip 252 and has tamper resistance, and the data processing unit 262 reads data, newly writes data, and updates data. The internal memory 270 stores, for example, various data, such as identification information, an electronic value (money or data having a value equivalent to money), or applications. Here, examples of the identification information according to the present embodiment include information indicating the power receiving device according to the present embodiment (for example, information that the external device can use to identify the power receiving device according to the present embodiment). Examples of the identification information according to the present embodiment include data indicating an identification number unique to the power receiving device according to the present embodiment, data indicating a kind of the power receiving device according to the present embodiment (for example, data indicating a maker or a model number), or power waveform data indicating power waveforms at the time of using the power receiving device according to the present embodiment (at the time of driving the power receiving device according to the present embodiment). Further, FIG. 4 illustrates an example in which the internal memory 270 stores the identification information 274 and the electronic value 276, but the data stored in the internal memory 270 is not limited to the above example.

For example, through the above-described configuration illustrated in FIG. 4, the IC chip 252 processes the high-frequency signal received through the communication antenna 250, and transmits the response signal from the communication antenna 250 through the load modulation.

For example, the wireless communication unit 204 includes the communication antenna 250 and the IC chip 252, and thus processes the high-frequency signal transmitted from the external connection device such as the power supply device 100A and transmits the response signal through the load modulation. Further, the configuration of the wireless communication unit 204 according to the present embodiment is not limited to the configuration illustrated in FIG. 4. For example, in the wireless communication unit 204, the structural elements configuring the IC chip 252 illustrated in FIG. 4 may not be configured in the form of an IC chip.

For example, when the wireless communication unit 104 illustrated in FIG. 4 is arranged in the power supply device according to the present embodiment, and the wireless communication unit 204 illustrated in FIG. 4 is arranged in the power receiving device according to the present embodiment, the power supply device according to the present embodiment and the power receiving device according to the present embodiment can perform wireless communication using the wireless communication technique such as the communication technique by NFC.

Here, by performing the wireless communication technique such as the communication technique by NFC or the wireless communication by the RFID technique, the power receiving device according to the present embodiment can be driven by power obtained from the received high-frequency signal and can transmit stored information by performing the load modulation. In other words, in the communication system including the power supply device according to the present embodiment and the power receiving device according to the present embodiment, the power receiving device according to the present embodiment can perform wireless communication even when a separate power supply circuit to perform communication is not arranged. Further, for example, the power receiving device according to the present embodiment can transmit stored information by performing the load modulation even when a signal (a signal representing the user's instruction) according to the user's operation is not input.

2. Power Line Communication of Present Embodiment

Figure 5:
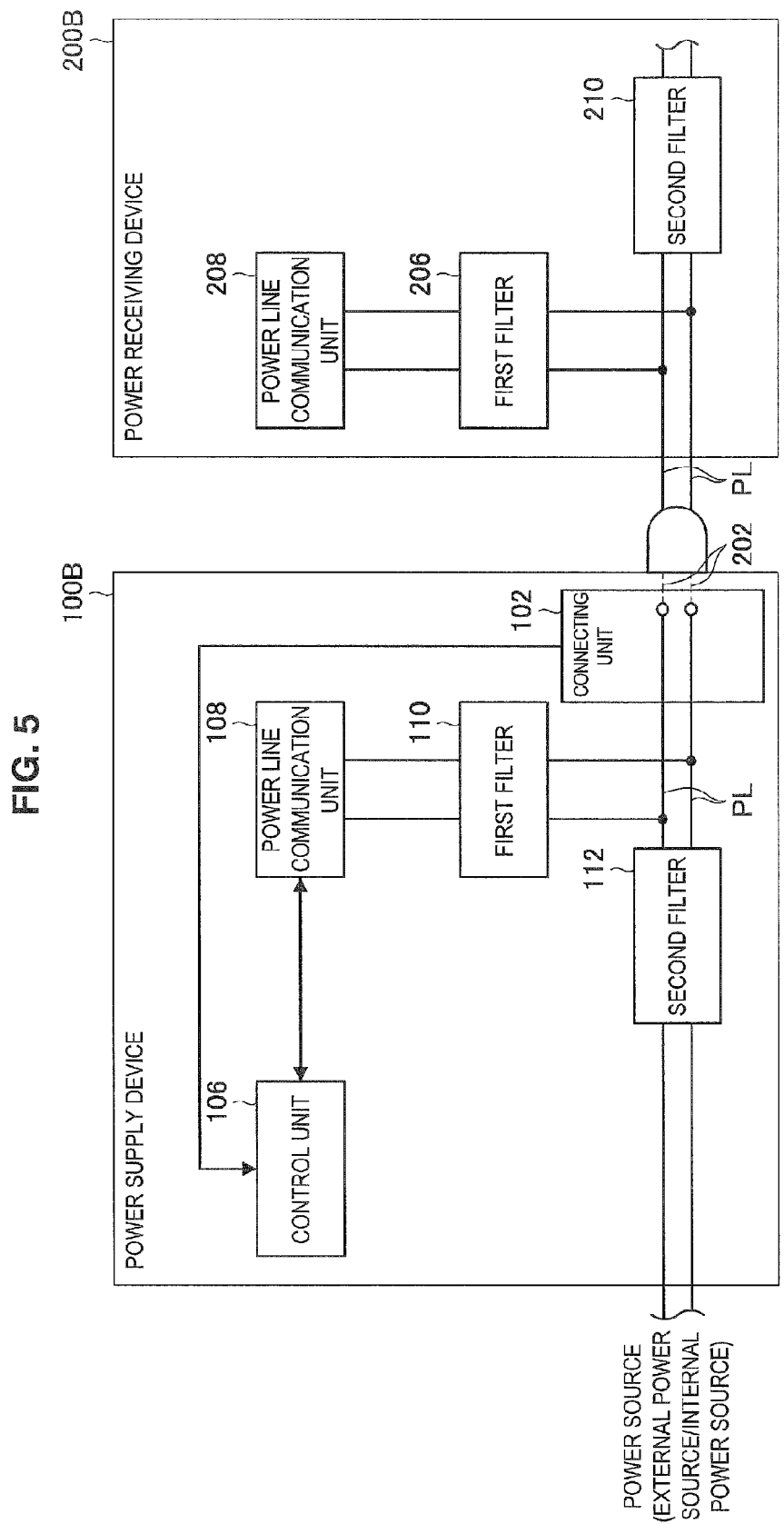
FIG. 5 is an explanatory diagram for describing an example of power line communication of the present embodiment.

Next, the power line communication of the present embodiment will be described. FIG. 5 is an explanatory diagram for describing an example of the power line communication of the present embodiment. In the following, the power line communication of the present embodiment will be described using a power supply device 100B and a power receiving device 200B illustrated in FIG. 5 as an example. FIG. 5 illustrates structural elements related to the power line communication of the present embodiment in the configuration of the power supply device according to the present embodiment and the configuration of the power receiving device according to the present embodiment. In the power receiving device according to the present embodiment, for example, the structural elements related to the power line communication may be disposed in a plug as in the power receiving device 200A illustrated in FIG. 3.

2-1. Power Supply Device 100B

For example, the power supply device 100B includes a connecting unit 102, a control unit 106, a power line communication unit 108, a first filter 110, and a second filter 112.

For example, the power supply device 100B may further include a ROM (not shown), a RAM (not shown), a storage unit (not shown), and the like. For example, the structural elements of the power supply device 100B are connected to one another via a bus serving as a data transmission path. Here, the ROM (not shown) stores a program or control data such as a calculation parameter, which is used by the control unit 106. The RAM (not shown) temporarily stores a program executed by the control unit 106 or the like.

The storage unit (not shown) stores a variety of data including identification information acquired from the external connection device such as the power receiving device 200B, an application, and the like. Here, a magnetic recording medium such as a hard disk or a non-volatile memory such as an Electrically Erasable and Programmable Read Only Memory (EEPROM), a flash memory, a Magnetoresistive Random Access Memory (MRAM), a Ferroelectric Random Access Memory (FeRAM), and a Phase change Random Access Memory (PRAM) may be used as the storage unit (not shown). Further, the storage unit (not shown) may be removably mounted in the power supply device 100B.

The control unit 106 is constituted by an MPU or an IC circuit in which various kinds of circuits are integrated, and controls the components of the power supply device 100B. More specifically, for example, the control unit 106 controls the communication in the power line communication unit 108 by transferring the high-frequency signal generation command or the high-frequency signal transmission stop command to the power line communication unit 108 based on the detection signal transferred from the connecting unit 102 or the response signal of the external connection device such as the power receiving device 200B transferred from the power line communication unit 108. Here, as the control unit 106 transfers the high-frequency signal generation command or the high-frequency signal transmission stop command to the power line communication unit 108 based on the detection signal, communication with the external connection device which is the external device connected via the power line can be actually performed.

As the control unit 106 transfers the high-frequency signal generation command or the high-frequency signal transmission stop command to the power line communication unit 108 as described above, for example, the power line communication unit 108 can transmit the high-frequency signal based on the detection result in the connecting unit 102. Further, as the control unit 106 transfers the high-frequency signal generation command or the high-frequency signal transmission stop command to the power line communication unit 108 based on the response signal, it is possible to control communication with the external connection device such as the power receiving device 200B, which is performed via the power line. In addition, for example, as the control unit 106 transfers the high-frequency signal generation command to the power line communication unit 108 at regular intervals or irregular intervals, it is possible to cause the power line communication unit 108 to transmit the high-frequency signal at regular intervals or irregular intervals.

The power line communication unit 108 undertakes communication with the external connection device such as the power receiving device 200B via the power line.

Figure 6:
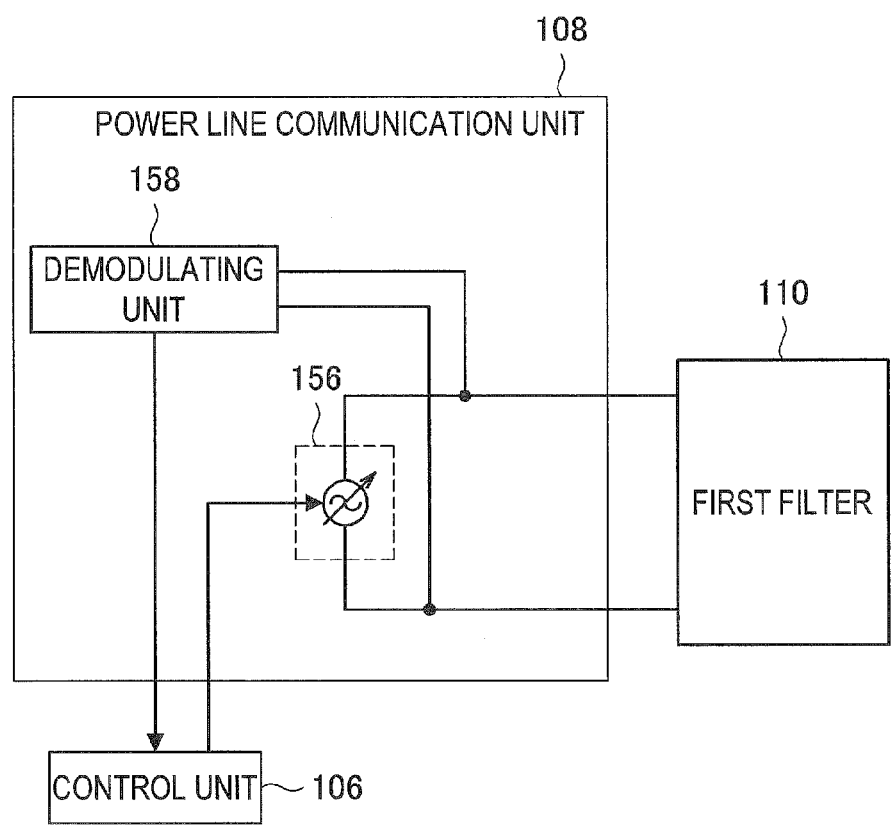
FIG. 6 is an explanatory diagram illustrating an example of a configuration of a power line communication unit arranged in a power supply device according to the present embodiment.

FIG. 6 is an explanatory diagram illustrating an example of a configuration of the power line communication unit 108 arranged in the power supply device 100B according to the present embodiment. Here, in FIG. 6, the control unit 106 and the first filter 110 are illustrated together. For example, the power line communication unit 108 includes a high-frequency signal generating unit 156 and a demodulating unit 158, and functions as a reader/writer (or an interrogator) in the NFC or the like. For example, the power line communication unit 108 may further include an encryption circuit (not shown) or a communication anti-collision circuit.

For example, upon receiving the high-frequency signal generation command transferred from the control unit 106, the high-frequency signal generating unit 156 generates the high-frequency signal corresponding to the high-frequency signal generation command. Further, upon receiving the high-frequency signal transmission stop command that is transferred from the control unit 106 and represents the transmission stop of the high-frequency signal, the high-frequency signal generating unit 156 stops the generation of the high-frequency signal. Here, in FIG. 6, AC power is illustrated as the high-frequency signal generating unit 156, but the high-frequency signal generating unit 156 according to the present embodiment is not limited to this example. For example, the high-frequency signal according to the present embodiment generating unit 132 may include a modulating circuit (not shown) that performs ASK modulation and an amplifying circuit (not shown) that amplifies an output of the modulating circuit.

Here, for example, the high-frequency signal including the identification information transmission request to request the external connection device to transmit the identification information, or the high-frequency signal including various kinds of processing commands on the external connection device or data to be processed may be used as the high-frequency signal generated by the high-frequency signal generating unit 156. However, the high-frequency signal generated by the high-frequency signal generating unit 156 is not limited to this example. For example, the high-frequency signal according to the present embodiment may be a signal (for example, a non-modulated signal) causing the power line communication unit 208 of the power receiving device 200B to perform power supply.

For example, the demodulating unit 158 demodulates the response signal from the external connection device by performing envelope detection on a change in amplitude of a voltage between the high-frequency signal generating unit 156 and the first filter 110 and binarizing the detected signal. Then, the demodulating unit 158 transfers the demodulated response signal (for example, the response signal representing the identification information or the response signal representing the response based on processing corresponding to the high-frequency signal) to the control unit 106. The demodulating device of the response signal in the demodulating unit 158 is not limited to the above example, and, for example, the demodulating unit 158 can demodulate the response signal using a change in a phase of a voltage between the high-frequency signal generating unit 156 and the first filter 110.

For example, through the configuration illustrated in FIG. 6, the power line communication unit 108 of the present embodiment can function as the reader/writer in the NFC or the like and perform communication with the external connection device via the power line.

Figure 7:
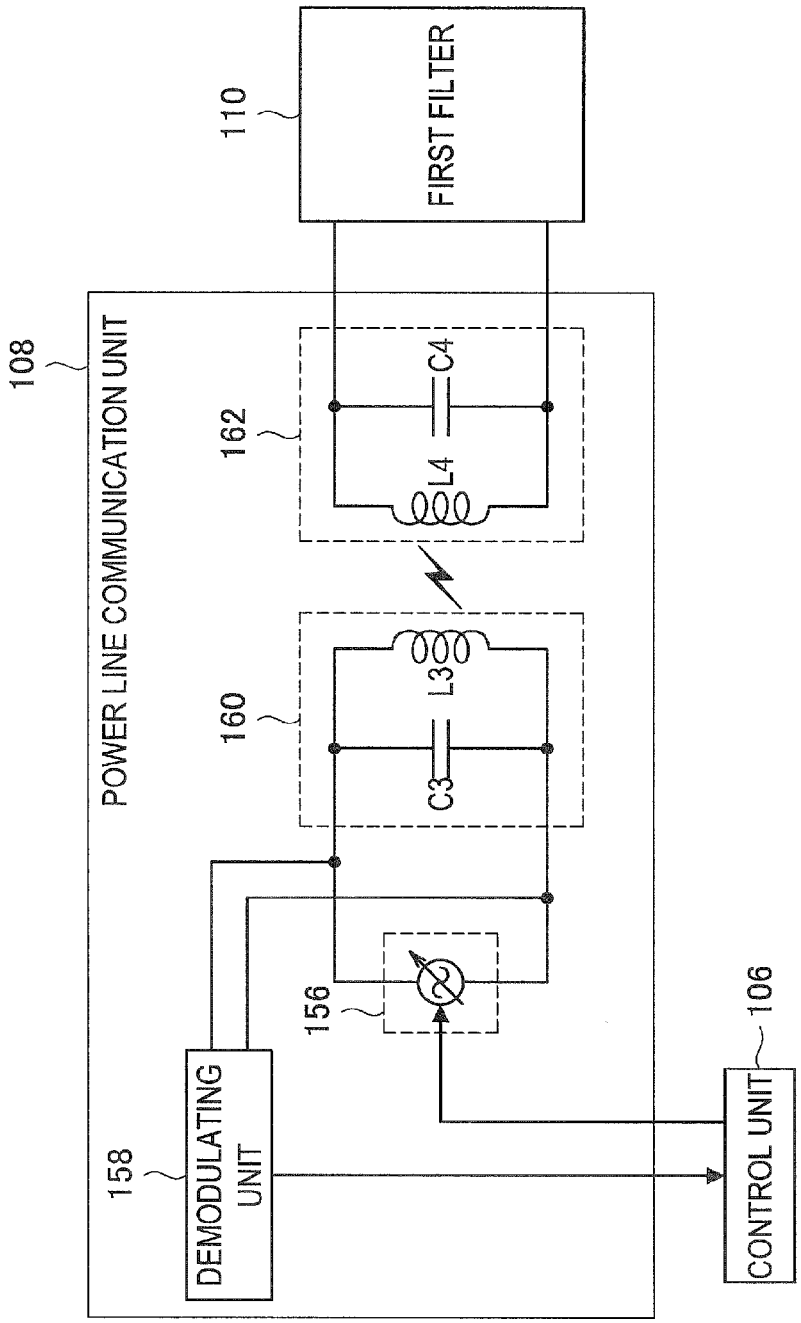
FIG. 7 is an explanatory diagram illustrating another example of a power line communication unit arranged in a power supply device according to the present embodiment.

The configuration of the power line communication unit 108 of the present embodiment is not limited to the configuration illustrated in FIG. 6. FIG. 7 is an explanatory diagram illustrating another example of the power line communication unit 108 arranged in the power supply device 100B according to the present embodiment. Here, in FIG. 7, the control unit 106 and the first filter 110 are illustrated together, similarly to FIG. 6.

The power line communication unit 108 related to another example includes a high-frequency signal generating unit 156, a demodulating unit 158, a first high-frequency transceiving unit 160, and a second high-frequency transceiving unit 162. For example, the power line communication unit 108 related to another example may further include an encryption circuit (not shown) or a communication anti-collision circuit.

The high-frequency signal generating unit 156 generates the high-frequency signal in response to the high-frequency signal generation command, and stops the generation of the high-frequency signal in response to the high-frequency signal transmission stop command, similarly to the high-frequency signal generating unit 156 illustrated in FIG. 6.

The demodulating unit 158 demodulates the response signal from the external connection device by performing envelope detection on a change in amplitude of a voltage in an antenna end of the high-frequency signal generating unit 156 and binarizing the detected signal. The demodulating device of the response signal in the demodulating unit 158 is not limited to the above example, and, for example, the demodulating unit 158 can demodulate the response signal using a change in a phase of a voltage in the antenna end of the high-frequency signal generating unit 156.

For example, the first high-frequency transceiving unit 160 includes a coil (hereinafter, an inductor) L3 having a predetermined inductance and a capacitor C3 having a predetermined capacitance and so configures a resonance circuit. Here, for example, the frequency of the high-frequency signal such as 13.56 [MHz] may be used as the resonance frequency of the first high-frequency transceiving unit 160. Through the above-described configuration, the first high-frequency transceiving unit 160 can transmit the high-frequency signal generated by the high-frequency signal generating unit 156, and receive the response signal transmitted from the external connection device through the second high-frequency transceiving unit 162. In other words, the first high-frequency transceiving unit 160 functions as a first communication antenna in the power line communication unit 108.

For example, the second high-frequency transceiving unit 162 includes a coil L4 having a predetermined inductance and a capacitor C4 having a predetermined capacitance and so configures a resonance circuit. Here, for example, the frequency of the high-frequency signal such as 13.56 [MHz] may be used as the resonance frequency of the second high-frequency transceiving unit 162. Through the above-described configuration, the second high-frequency transceiving unit 162 can receive the high-frequency signal transmitted from the first high-frequency transceiving unit 160 and transmit the response signal transmitted from the external connection device. In other words, the second high-frequency transceiving unit 162 functions as a second communication antenna in the power line communication unit 108.

Through the configuration illustrated in FIG. 7, the power line communication unit 108 of the present embodiment can function as the reader/writer in NFC and perform communication with the external connection device via the power line, similarly to the configuration illustrated in FIG. 6.

In the power supply device 100B according to the present embodiment, an example of a configuration related to the power line communication of the present embodiment will be described with reference to FIG. 5 again. The first filter 110 is connected between the power line communication unit 108 and the power line PL, and functions to filter a signal transferred from the power line PL. More specifically, the first filter 110 has a function of blocking at least a signal of a frequency of power supplied from the external connection device such as the power receiving device 200B via the power among signals transferred from the power line PL but passing the high-frequency signal. The power supply device 100B includes the first filter 110 and thus does not transfer a signal of a frequency of power that may cause noise to the power line communication unit 108. Thus, it is possible to improve the accuracy of communication between the power line communication unit 108 and the external connection device (more technically, for example, a power line communication unit arranged in the external connection device such as the power line communication unit 208 of the power receiving device 200B, which will be described later).

Figure 8:
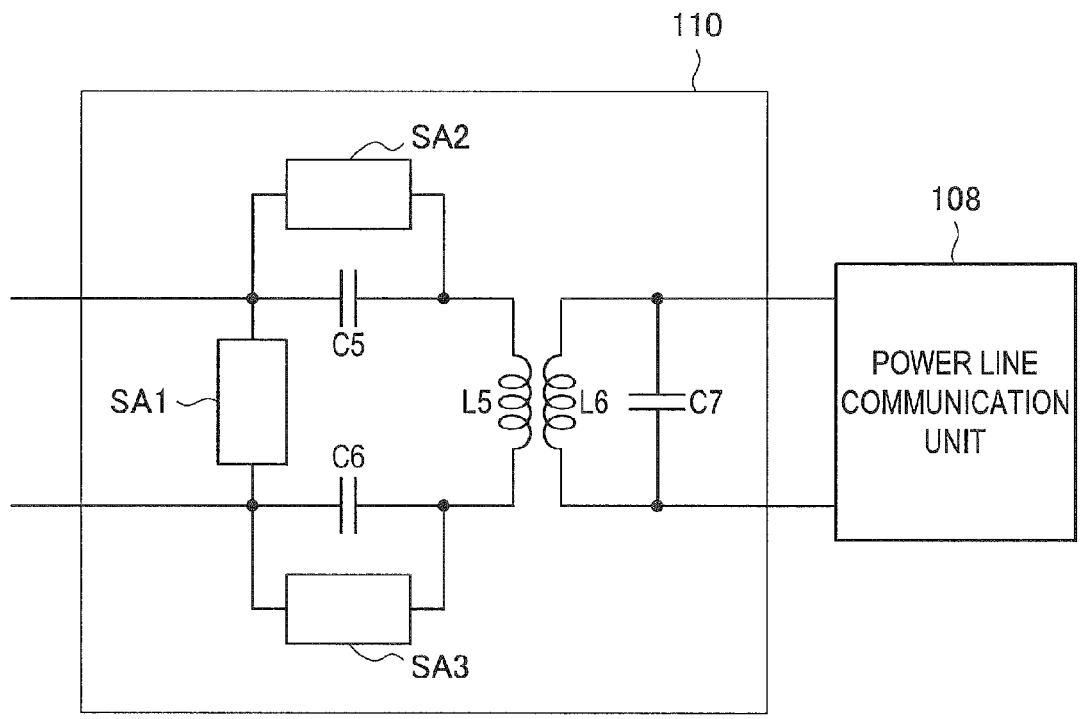
FIG. 8 is an explanatory diagram illustrating an example of a configuration of a first filter arranged in a power supply device according to the present embodiment.

FIG. 8 is an explanatory diagram illustrating an example of a configuration of the first filter 110 arranged in the power supply device 100B according to the present embodiment. The first filter 110 includes inductors L5 and L6, capacitors C5 to C7 and surge absorbers SA1 to SA3. Of course, the configuration of the first filter 110 according to the present embodiment is not limited to the configuration illustrated in FIG. 8.

In the power supply device 100B according to the present embodiment, an example of a configuration of the power line communication of the present embodiment will be described with reference to FIG. 5 again. The second filter 112 is disposed on the power line PL between the connecting unit 102 and the power, and functions to perform filtering on a signal transferred from the connecting unit 102 side. Here, for example, an external power source such as a commercial power source or an internal power source such as a battery may be used as a power source according to the present embodiment.

More specifically, the second filter 112 has a function of blocking at least the high-frequency signal transmitted by the power line communication unit 108 or the high-frequency signal transmitted by the external connection device but passing a signal of a frequency of power supplied to the external connection device. The power supply device 100B includes the second filter 112 and thus can block, for example, the high-frequency signal related to the communication via the power line or a noise component such as a noise component transferred from the external connection device side. In other words, the second filter 112 functions as a so-called power splitter.

Figure 9:
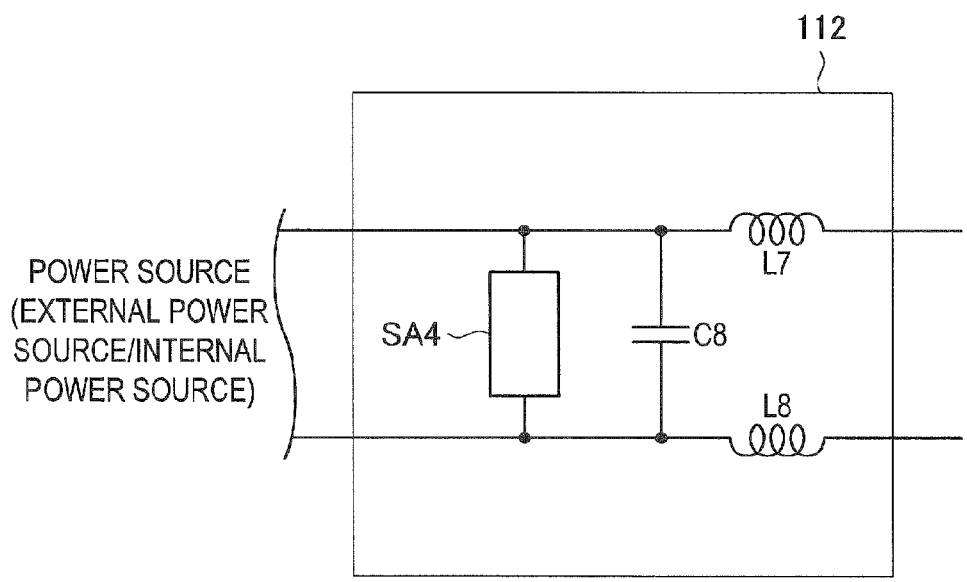
FIG. 9 is an explanatory diagram illustrating an example of a configuration of a second filter arranged in a power supply device according to the present embodiment.

FIG. 9 is an explanatory diagram illustrating an example of a configuration of the second filter 112 arranged in the power supply device 100B according to the present embodiment. The second filter 112 includes inductors L7 and L8, a capacitor C8, and a surge absorber SA4. Of course, the configuration of the second filter 112 according to the present embodiment is not limited to the configuration illustrated in FIG. 9.

For example, through the configuration illustrated in FIG. 5, the power supply device 100B according to the present embodiment can perform communication with the external connection device such as the power receiving device 200B connected to the connecting unit 102 via the power line. Further, for example, through the configuration illustrated in FIG. 5, the power supply device 100B according to the present embodiment can cause the external connection device to perform a predetermined process based on the transmitted high-frequency signal such as transmission of the identification information and an accounting process using an electronic value.

2-2. Power Receiving Device 200B

For example, the power receiving device 200B includes a connecting unit 202, a first filter 206 (a communication filter), a power line communication unit 208, and a second filter 210.

For example, the power receiving device 200B includes a battery (not shown) and various kinds of devices (for example, an MPU, various kinds of processing circuits, and a driving device (not shown)) for implementing the function of the power receiving device 200B, which are arranged at the stage subsequent to the second filter 210 (on the side of the second filter 210 illustrated in FIG. 5 opposite to the power supply device 100B). In other words, for example, the power receiving device 200B can cause the battery (not shown) to be charged by power supplied from the external connection device such as the power supply device 100B via the power line and can implement the function of the power receiving device 200B using the supplied power. For example, when the power receiving device 200B is a vehicle such as an electric vehicle, the power receiving device 200B is supplied with power to charge an internal battery and rotates a vehicle using power from the battery. Further, when the power receiving device 200B includes a display device capable of displaying an image (a moving image/a still image) and/or text, the power receiving device 200B is supplied with power and causes an image or text to be displayed on the display screen of the display device. Further, the display device may undertake the function of the notifying unit (which will be described later) in the power receiving device according to the present embodiment.

The first filter 206 is connected between the power line (technically, the power line PL in the power receiving device 200B) and the power line communication unit 208, and functions to perform filtering on a signal transferred from the power line. More specifically, the first filter 206 has a function of blocking at least a signal of a frequency of power among signals transferred from the power line but passing the high-frequency signal. The power receiving device 200B includes the first filter 206 and thus does not transfer a signal of a frequency of power that causes a noise to the power line communication unit 208. Thus, it is possible to improve the accuracy of communication between the power line communication unit 208 and the external connection device (more technically, for example, the power line communication unit arranged in the external connection device such as the power line communication unit 108 of the power supply device 100B.

Here, for example, the first filter 206 has the same configuration as the first filter 110 of the power supply device 100B illustrated in FIG. 8. Of course, the configuration of the first filter 206 according to the present embodiment is not limited to the configuration illustrated in FIG. 8.

The power line communication unit 208 performs communication with the external connection device such as the power supply device 100B via the power line based on the high-frequency signal. More specifically, for example, when the power line communication unit 208 receives the high-frequency signal from the external connection device, the power line communication unit 208 is driven by power obtained from the high-frequency signal and performs processing based on the received high-frequency signal. Then, the power line communication unit 208 transmits the response signal according to the above processing as the high-frequency signal through the load modulation.

For example, upon receiving a high-frequency signal including an identification information transmission request to request transmission of identification information, the power line communication unit 208 reads the stored identification information based on the identification information transmission request included in the high-frequency signal. Then, the power line communication unit 208 transmits the read identification information such that the read identification information is superimposed on the power line by load modulation. Further, for example, upon receiving the high-frequency signal including various kinds of processing commands or data to be processed, the power line communication unit 208 performs the process based on a processing command or data included in the high-frequency signal. Then, the power line communication unit 208 transmits a response signal based on the above process such that the response signal is superimposed on the power line by load modulation. In other words, for example, the power line communication unit 208 functions as a responder in NFC or the like.

Further, the power line communication unit 208 actively performs the processing related to the notification control method according to the present embodiment (for example, the processing (1) (determination processing) and the processing (2) (notification control processing)). More specifically, the power line communication unit 208, as described above, performs communication with the external connection device, such as the power supply device 100B, through the power line by performing the load modulation, and determines whether the transmitted power is chargeable, based on the power identification information transmitted from the external connection device (which corresponds to the processing (1) (determination processing)). Further, based on the determination result of the processing (1) (determination processing), the power line communication unit 208, for example, causes the notifying unit (which will be described later) arranged in the power receiving device according to the present embodiment and/or the external device to perform notification based on the determination result of the processing (corresponding to the processing (2) (notification control processing)).

Figure 10:
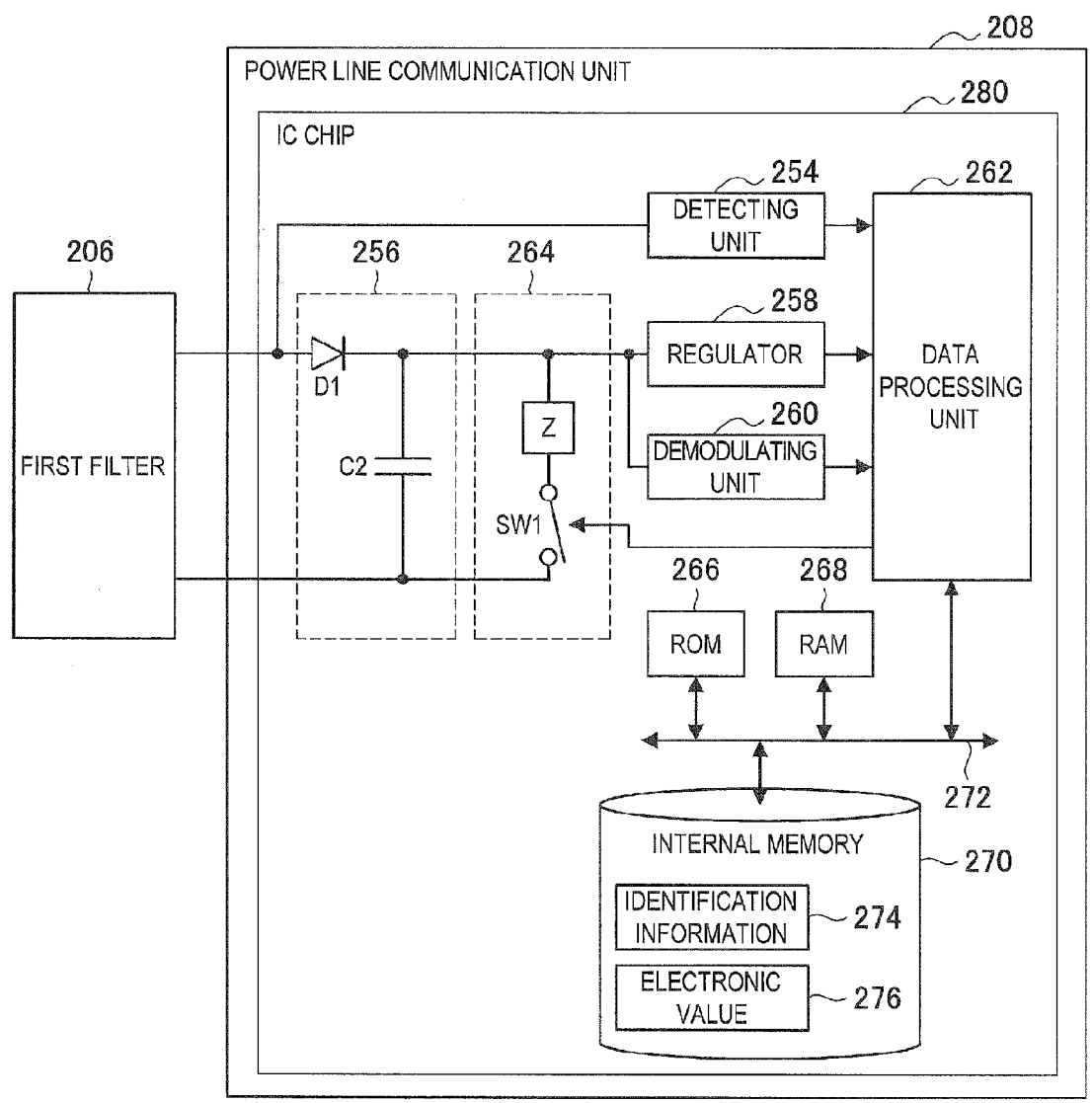
FIG. 10 is an explanatory diagram illustrating an example of a configuration of a power line communication unit arranged in a power receiving device according to the present embodiment.

FIG. 10 is an explanatory diagram illustrating an example of a configuration of the power line communication unit 208 arranged in the power receiving device 200B according to the present embodiment. Here, FIG. 10 illustrates this together with the first filter 206. Further, FIG. 10 illustrates a configuration in which the power line communication unit 208 includes an IC chip 280 that demodulates and processes the received high-frequency signal and transmits the response signal through the load modulation. In the power line communication unit 208 of the present embodiment, each of structural elements configuring the IC chip 280 illustrated in FIG. 10 may not be configured in the form of an IC chip.

For example, the IC chip 280 includes a detecting unit 254, a detecting unit 256, a regulator 258, a demodulating unit 260, a data processing unit 262, and a load modulating unit 264. Although not shown in FIG. 10, for example, the IC chip 280 may further include a protection circuit (not shown) for preventing an overvoltage or an overcurrent from being applied to the data processing unit 262. Here, for example, a clamp circuit constituted by a diode or the like may be used as the protection circuit (not shown).

For example, the IC chip 280 includes a ROM 234, a RAM 236, and an internal memory 238. For example, the data processing unit 262, the ROM 234, the RAM 236, and the internal memory 238 are connected to one another via a bus 240 serving as a data transmission path.

Here, when the configuration of the IC chip 280 illustrated in FIG. 10 is compared with the configuration of the IC chip 252 arranged in the wireless communication unit 204 illustrated in FIG. 4 which relates to the wireless communication according to the present embodiment, it can be understood that the IC chip 280 has the same configuration as the IC chip 252 illustrated in FIG. 4.

As described above, the high-frequency signal based on the received carrier wave is input to the IC chip 252 illustrated in FIG. 4 through the communication antenna 250, and the IC chip 252 modulates and processes the high-frequency signal based on the carrier wave received by the communication antenna 250, and transmits the response signal to the communication antenna 250 through the load modulation. On the other hand, the high-frequency signal transmitted from the external connection device such as the power supply device 100B, which is transferred from the first filter 206, is input to the IC chip 280. Further, the IC chip 280 has the same configuration as the IC chip 252 illustrated in FIG. 4 as illustrated in FIG. 10. Thus, the IC chip 280 can demodulate and process the input high-frequency signal and transmit the response signal corresponding to the high-frequency signal through the load modulation, similarly to the IC chip 252 illustrated in FIG. 4.

Further, the IC chip 280 is connected to the first filter 206 as illustrated in FIG. 10, and the first filter 206 is connected to the power line PL as illustrated in FIG. 5. Thus, the response signal transmitted from the IC chip 280 is superimposed on the power line through the first filter 206.

For example, through the configuration illustrated in FIG. 10, the IC chip 280 processes the received high-frequency signal, and performs transmission such that the processed signal is superimposed on the response signal through the load modulation. Of course, the configuration of the IC chip 280 according to the present embodiment is not limited to the configuration illustrated in FIG. 10.

For example, through the configuration illustrated in FIG. 10, the power line communication unit 208 can be driven by power obtained from the received high-frequency signal, perform processing represented by the received high-frequency signal, and transmit the response signal according to the processing through the load modulation.

Figure 11:
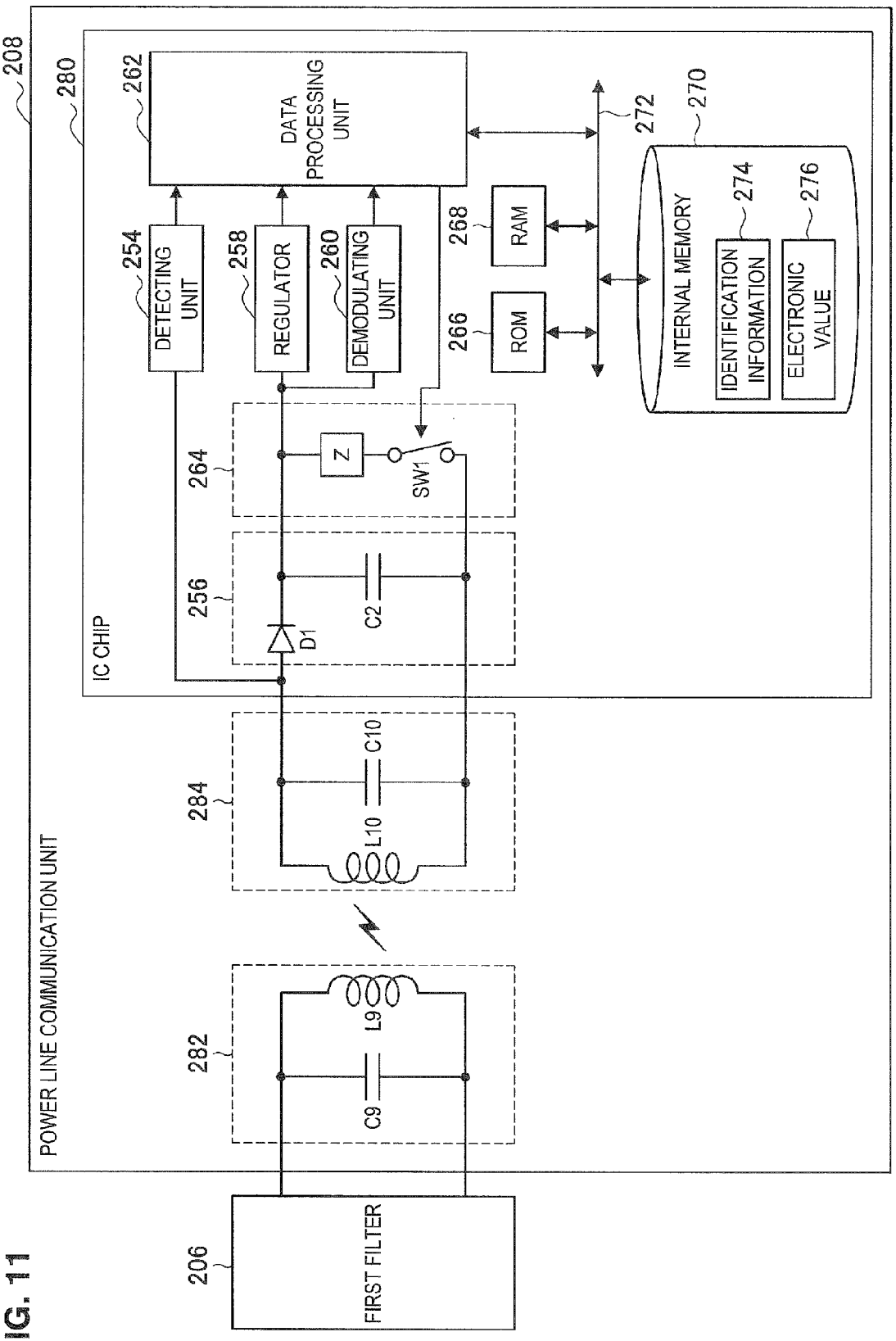
FIG. 11 is an explanatory diagram illustrating another example of a configuration of a power line communication unit arranged in a power receiving device according to the present embodiment.

The power line communication unit 208 of the present embodiment is not limited to the configuration illustrated in FIG. 10. FIG. 11 is an explanatory diagram illustrating another example of the configuration of the power line communication unit 208 arranged in the power receiving device 200B according to the present embodiment. Here, FIG. 11 illustrates this together with the first filter 206. In the power line communication unit 208 of the present embodiment, each of structural elements configuring the IC chip 280 illustrated in FIG. 11 may not be configured in the form of an IC chip.

The power line communication unit 208 according to another example includes a first high-frequency transceiving unit 282, a second high-frequency transceiving unit 284, and an IC chip 280.

For example, the first high-frequency transceiving unit 282 includes a coil L9 having a predetermined inductance and a capacitor C9 having a predetermined capacitance and so configures a resonance circuit. Here, for example, the frequency of the high-frequency signal such as 13.56 [MHz] may be used as the resonance frequency of the first high-frequency transceiving unit 282. Through the above-described configuration, the first high-frequency transceiving unit 282 can transmit the high-frequency signal transferred from the first filter 206, and receive the response signal transmitted from the second high-frequency transceiving unit 284. In other words, the first high-frequency transceiving unit 282 functions as a first communication antenna in the power line communication unit 208.

For example, the second high-frequency transceiving unit 284 includes a coil L10 having a predetermined inductance and a capacitor C10 having a predetermined capacitance and so configures a resonance circuit. Here, for example, the frequency of the high-frequency signal such as 13.56 [MHz] may be used as the resonance frequency of the second high-frequency transceiving unit 284. Through the above-described configuration, the second high-frequency transceiving unit 284 can receive the high-frequency signal transmitted from the first high-frequency transceiving unit 282 and transmit the response signal. More specifically, the second high-frequency transceiving unit 284 generates an inductive voltage through the electromagnetic induction upon receiving the high-frequency signal, and outputs a reception voltage obtained by resonating the inductive voltage at a predetermined resonance frequency to the IC chip 280. Further, the second high-frequency transceiving unit 284 transmits the response signal through the load modulation performed in the load modulating unit 264 arranged in the IC chip 280. In other words, the second high-frequency transceiving unit 284 functions as a second communication antenna in the power line communication unit 208.

The IC chip 280 performs the same processing as in the IC chip 280 illustrated in FIG. 10 based on the reception voltage transferred from the second high-frequency transceiving unit 284.

Even through the configuration illustrated in FIG. 11, the power line communication unit 208 can be driven by power obtained from the received high-frequency signal, perform processing represented by the received high-frequency signal, and transmit the response signal according to the processing through the load modulation, similarly to the configuration illustrated in FIG. 10. Further, when the power line communication unit 208 has the configuration illustrated in FIG. 11, the power line communication unit 208 can use an IC chip related to, for example, NFC or RFID, and thus there is an advantage in that implementation can be easily performed.

In the power receiving device 200B according to the present embodiment, an example of the configuration of the power line communication of the present embodiment will be described with reference to FIG. 5 again. The second filter 210 functions to perform filtering on a signal transferred from the external connection device side such as the power supply device 100B through the power line PL. More specifically, the second filter 210 has a function of blocking at least the high-frequency signal transmitted by the external connection device or the high-frequency signal transmitted by the power line communication unit 208 but passing a signal of a frequency of power supplied through the power line PL. The power receiving device 200B includes the second filter 210 and thus can block, for example, the high-frequency signal related to the communication via the power line or a noise component such as a noise component transferred from the external connection device side. In other words, the second filter 210 functions as a so-called power splitter, similarly to the second filter 112 arranged in the power supply device 100B.

Here, for example, the second filter 210 may have the same configuration as the second filter 112 of the power supply device 100B illustrated in FIG. 9. Of course, the configuration of the second filter 210 according to the present embodiment is not limited to the configuration illustrated in FIG. 9.

For example, as the power supply device according to the present embodiment includes the power line communication unit 108 illustrated in FIG. 5, and the power receiving device according to the present embodiment includes the power line communication unit 208 illustrated in FIG. 5, the power supply device according to the present embodiment and the power receiving device according to the present embodiment can perform power line communication in which the wireless communication technique such as the communication technique by NFC is applied to the wired communication.

Here, the communication device using the wireless communication technique such as the communication technique by NFC is much smaller in circuit size than an existing PLC modem, and thus the size of the communication device can be reduced to the same size as an IC chip. For example, with the spread of devices capable of performing communication using the wireless communication technique such as the communication technique by the NFC, for example, a portable telephone in which an IC card or an IC chip is mounted, the communication device using the wireless communication technique such as the communication technique by the NFC or RFID technique is cheaper than an existing PLC modem.

Further, as the wireless communication technique such as the communication technique by the NFC or RFID technique is applied to the wired communication, the power receiving device according to the present embodiment can be driven by power obtained from the received high-frequency signal through the power line and can transmit stored information by performing the load modulation. In other words, in the communication system including the power supply device according to the present embodiment and the power receiving device according to the present embodiment, the power receiving device according to the present embodiment can perform wired communication even when a separate power supply circuit to perform communication is not arranged. Further, for example, the power receiving device according to the present embodiment can transmit stored information by performing the load modulation even when a signal (a signal representing the user's instruction) according to the user's operation is not input.

Thus, when the wireless communication technique such as the communication technique by the NFC or the RFID technique is used, it is possible to implement wired communication in which a cost is low, a limitation on the size of a communication device is mitigated, and power consumption is low, more than, for example, when conventional wired communication such as an existing PLC is used.

(Power Receiving Device According to Present Embodiment)

The following description is given of an example of a configuration of the power receiving device according to the present embodiment, which can perform the processing related to the notification control method according to the present embodiment. Further, in the following, the example of the configuration of the power receiving device according to the present embodiment will be described in connection with an example in which the power receiving device according to the present embodiment and the power supply device (external connection device) according to the present embodiment perform communication through the power line communication illustrated in FIG. 5 according to the present embodiment.

[1] Power Receiving Device According to First Embodiment

Figure 12:
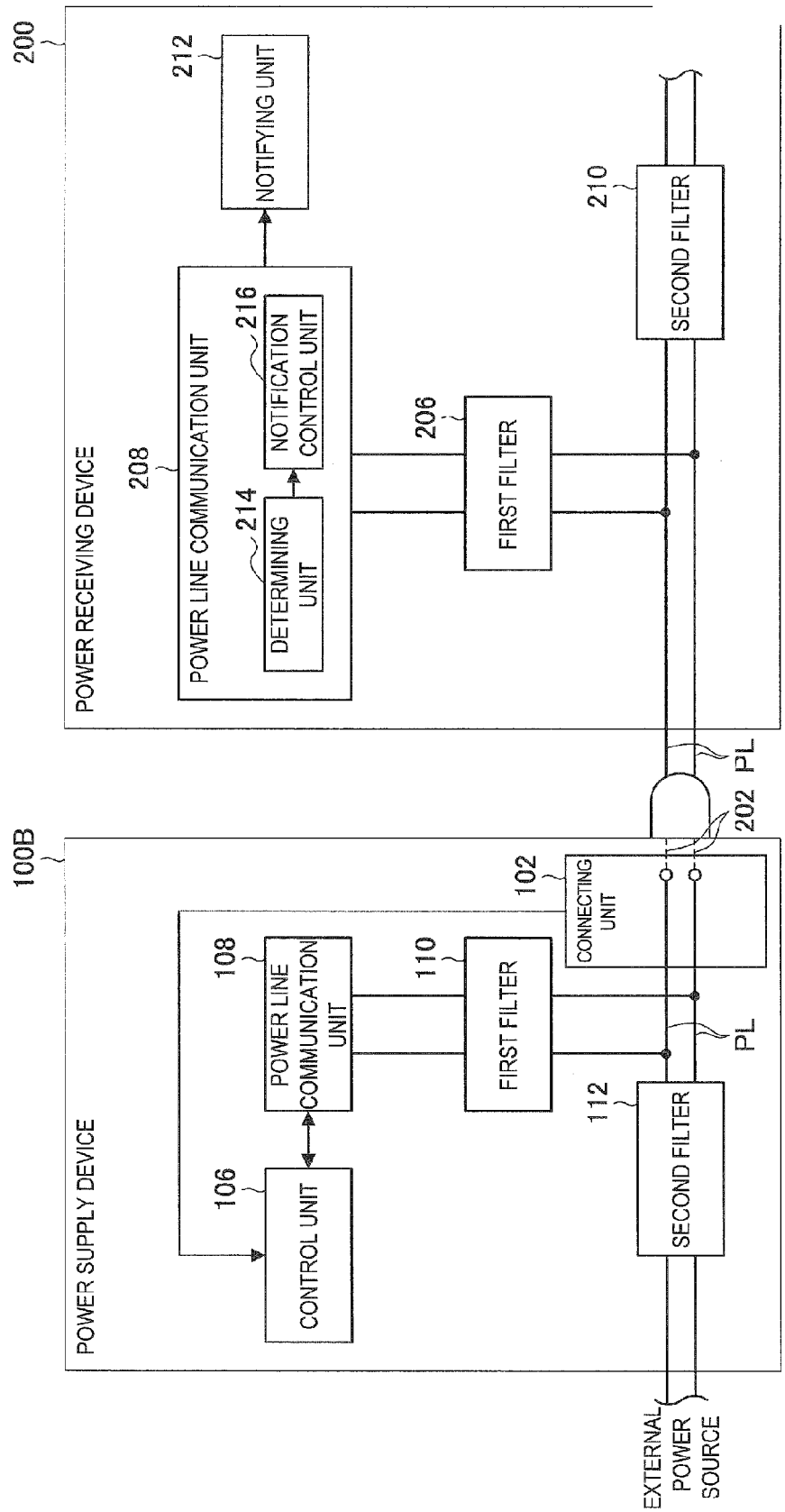
FIG. 12 is an explanatory diagram illustrating an example of a configuration of a power receiving device according to a first embodiment.

The following description will be given of an example of a configuration of the power receiving device according to the first embodiment, which can perform the first determination processing and the notification control processing as the processing related to the notification control method according to the present embodiment. FIG. 12 is an explanatory diagram illustrating an example of a configuration of the power receiving device 200 according to the first embodiment. Here, the power supply device 100B illustrated in FIG. 5 is illustrated in FIG. 12 together.

The power receiving device 200 includes, for example, a connecting unit 202, a first filter 206, a power line communication unit 208, a second filter 210, and a notifying unit 212. Further, for example, the power receiving device 200 includes a battery (not shown) and various kinds of devices (not shown) for implementing the function of the power receiving device 200, which are arranged at the stage subsequent to the second filter 210 (on the side of the second filter 210 illustrated in FIG. 12 opposite to the power supply device 100B).

As described above with reference to FIGS. 10 and 11, the power line communication unit 208 undertakes the function of the communication unit that perform communication with the external connection device through the load modulation based on the signal transmitted from the external connection device.

Further, the power line communication unit 208 includes, for example, a determining unit 214 and a notification control unit 216, and actively performs the processing related to the notification control method according to the present embodiment (for example, the processing (1) (determination processing) and the processing (2) (notification control processing)). Here, in the power line communication unit 208, for example, the data processing unit 262 illustrated in FIGS. 10 and 11 functions as the determining unit 214 and the notification control unit 216.

Further, FIG. 12 illustrates an example in which the power line communication unit 208 actively performs the processing related to the notification control method according to the present embodiment (for example, the processing (1) (determination processing) and the processing (2) (notification control processing), but the configuration of the power receiving device according to the present embodiment is not limited to the above example. For example, in the power receiving device according to the present embodiment, either or both of the determining unit 214 and the notification control unit 216 may be separately provided. That is, in the power receiving device according to the present embodiment, either or both of the determining unit 214 and the notification control unit 216 can be realized with separate processing circuits such as MPU or the like. When the determining unit 214 and/or the notification control unit 216 are provided separately from the power line communication unit 208, the determining unit 214 and/or the notification control unit 216 performs the processing related to the notification control method according to the present embodiment by power obtained based on the high-frequency signal, power obtained from the power line PL, and power obtained from the internal power source such as the battery.

The determining unit 214 actively performs the first determination processing of the processing (1) (determination processing), and determines whether the transmitted power is chargeable, based on the power identification information transmitted from the external connection device such as the power supply device 100B.

Here, for example, when a high-frequency signal transmitted from the external connection device is received, the determining unit 214 performs the processing (1) (determination processing) by power obtained from the received high-frequency signal. Further, for example, when the high-frequency signal is not received, such as when the high-frequency signal is not received from the external connection device, the determining unit 214, performs the processing (1) (determination processing) by power obtained from the power line PL or power obtained from the internal power source such as the battery.

The notification control unit 216 actively performs the processing (2) (notification control processing), and performs notification based on the determination result transmitted from the determining unit 214.

More specifically, the notification control unit 216, for example, performs notification to the notifying unit 212 based on the determination result by transmitting a control signal (or control data) that controls the notification to the notifying unit 212. Here, examples of the control signal or the control data that controls the notification according to the present embodiment include a notification command for performing the notification. Further, examples of the control signal or the control data that controls the notification according to the present embodiment include data (for example, image data or voice data) that indicates the notification content.

Here, for example, when the high-frequency signal transmitted from the external connection device is received, the notification control unit 216 performs the processing (2) (notification control processing) by power obtained from the received high-frequency signal. Further, for example, when the high-frequency signal is not received, such as when the high-frequency signal is not received from the external connection device, the notification control unit 216 performs the processing (2) (notification control processing) by power obtained from the power line PL or power obtained from the internal power source such as the battery.

Further, when the receiving device 200 includes a communication unit (not shown) for performing wired/wireless communication with the external device through the network (or directly), the notification control unit 216, for example, may cause the external device to perform notification based on the communication result by causing the communication unit (not shown) to transmit the control data controlling the notification to the external device performing the notification.

Here, examples of the communication unit (not shown) for performing the wired/wireless communication with the external device according to the present embodiment include a communication antenna and a Radio Frequency (RF) circuit (wireless communication), IEEE 802.15.1 port and transceiving circuit (wireless communication), IEEE 802.11b port and transceiving circuit (wireless communication), and LAN port and transceiving circuit (wired communication). Further, examples of the communication unit (not shown) for performing the wired/wireless communication with the external device according to the present embodiment may include a configuration that supports an arbitrary standard capable of performing communication, such as Universal Serial Bus (USB) port and transceiving circuit, and an arbitrary configuration capable of communicating with the external device through the network. Examples of the network according to the present embodiment include a wired network such as LAN or Wide Area Network (WAN), a wireless network such as Wireless Local Area Network (WLAN) or Wireless Wide Area Network (WWAN) through a base station, and Internet using a communication protocol such as Transmission Control Protocol/Internet Protocol (TCP/IP).

The notifying unit 212 performs notification based on the determination result. More specifically, the notifying unit 212, for example, performs notification based on the control signal (or control data) that is transmitted from the power line communication unit 208. In addition, the notifying unit 212, for example, performs notification by being driven by power obtained based on the high-frequency signal, power obtained from the power line PL, and power obtained from the internal power source such as the battery.

Here, examples of the notifying unit 212 include a display device that undertakes the function of a display unit (not shown), a Digital Signal Processor (DSP), and a voice output device. For example, when the display device undertakes the function of the notifying unit 212, the power receiving device 200 can perform the warning to the effect that the transmitted power is chargeable (for example, to the effect that the power is to be charged), or the perform the notification based on the determination result to the effect that the transmitted power is not chargeable (for example, to the effect that the power is free of charge), to the user by the above-described visually notifying method. Further, for example, when the DSP and the voice output device undertakes the function of the notifying unit 212, the power receiving device 200 can perform the notification based on the determination result such as the warning to the effect that the transmitted power is chargeable, to the user by the above-described auditorily notifying method.

Further, the notifying unit 212 according to the present embodiment is not limited to the display device, or the DSP and the voice output device. For example, the notifying unit 212 may include any device for realizing the method appealing to the sense of the user. Further, the notifying unit 212 may be configured to realize a plurality of notifying methods, for example, by including the display device, the DSP, and the voice output device.

According to the configuration illustrated in FIG. 12, the power receiving device 200 performs the processing related to the notification control method according to the present embodiment (for example, the processing (1) (determination processing) and the processing (2) (notification control processing)). Therefore, according to the configuration illustrated in FIG. 12, the power receiving device 200 can notify the user whether the transmitted power is chargeable power.

Further, the configuration of the power receiving device according to the first embodiment is not limited to the configuration illustrated in FIG. 12. For example, as described above, the power receiving device according to the first embodiment may include a communication unit (not shown) for performing wired/wireless communication with the external device. In the above configuration, the power receiving device according to the first embodiment can perform the notification to the user based on the determination result such as the warning to the effect that the transmitted power is chargeable, in the external device that performs wired/wireless communication. Further, for example, when the power receiving device according to the first embodiment includes the communication unit (not shown), the power receiving device can be configured not to include the notifying unit 212.

In addition, the power receiving device according to the first embodiment may further include a power supply unit (not shown) that is arranged at the stage subsequent to the second filter 210 (on the side of the second filter 210 illustrated in FIG. 12 opposite to the power supply device 100B) to selectively block power transmitted through the power line PL. The power supply unit (not shown), for example, selectively blocks the power transmitted through the power line PL according to the control signal based on the determination result of the processing (1) (determination result), which is transmitted from the determining unit 214.

More specifically, for example, when it is determined in the processing (1) (determination processing) that the transmitted power is chargeable, the determining unit 214 transmits, to the power supply unit (not shown), the control signal of a voltage level for blocking the power transmitted through the power line PL. Therefore, the power supply unit (not shown) blocks the power transmitted through the power line PL according to the control signal transmitted from the determining unit 214. Here, examples of the power supply unit (not shown) include an on/off switch based on the control signal that is transmitted from the determining unit 214. The switch is constituted by, for example, a p-channel MOSFET or an n-channel MOSFET. In addition, the determining unit 214 transmits, to the power supply unit (not shown), the control signal of a voltage level corresponding to the conductivity type of the MOSFET constituting the switch of the power supply unit (not shown).

In the configuration including the power supply unit (not shown), the processing of the determining unit according to the first embodiment is not limited to the above example. For example, the determining unit according to the first embodiment has an operation mode that performs the control of the power supply unit (not shown), and an operation mode that does not perform the control of the power supply unit (not shown), and may selectively perform the control of the power supply unit (not shown) according to a set operation mode. Further, the setting of the operation mode of the determining unit according to the first embodiment is changed by, for example, a user's operation.

The power receiving device according to the first embodiment can perform the processing related to the notification control method according to the present embodiment since the power receiving device has the configuration illustrated in FIG. 12 (or the above-described configuration according to the modification of FIG. 12. The same hereinafter). Therefore, since the power receiving device according to the first embodiment has the configuration illustrated in FIG. 12, the power receiving device can notify the user whether the transmitted power is chargeable power.

Further, since the power receiving device according to the first embodiment notifies the user whether the transmitted power is chargeable, the user can recognize whether the power transmitted to the power receiving device is chargeable power. Therefore, since the power receiving device according to the first embodiment has the configuration illustrated in FIG. 12, the user convenience can be improved.

Further, the configuration of the power receiving device according to the first embodiment is not limited to the configuration illustrated in FIG. 12.

[1-1] First Modification

For example, FIG. 12 illustrates the configuration in which the power receiving device according to the first embodiment performs communication through the power line communication according to the present embodiment, but the power receiving device according to the first embodiment can also perform communication through wireless communication according to the present embodiment. More specifically, when the communication is performed through the wireless communication according to the present embodiment, the power receiving device according to the first embodiment has the configuration that performs communication through the wireless communication illustrated in FIG. 3 according to the present embodiment, instead of the configuration that performs communication through the power line communication illustrated in FIG. 5 according to the present embodiment.

Here, when the power receiving device has the configuration that performs communication through the wireless communication according to the present embodiment, the device according to the first modification of the first embodiment can perform, for example, the processing (1) (determination processing) and the processing (2) (notification control processing).

Therefore, even when the power receiving device has the configuration that performs communication through the wireless communication according to the present embodiment, the power receiving device according to the first embodiment can notify the user whether the transmitted power is chargeable, as in the case where the power receiving device has the configuration illustrated in FIG. 12. Further, even when the power receiving device has the configuration that performs communication through the wireless communication according to the present embodiment, the power receiving device according to the first embodiment can improve user convenience, as in the case where the power receiving device has the configuration illustrated in FIG. 12.

[1-2] Second Modification

In addition, the power receiving device according to the first embodiment, for example, may have both of the configuration that performs communication through the power line communication according to the present embodiment and the configuration that performs communication through the wireless communication according to the present embodiment. More specifically, the power receiving device according to the first embodiment, for example, has the configuration that performs communication through the wireless communication illustrated in FIG. 3 according to the present embodiment and the configuration that performs communication through the power line communication illustrated in FIG. 5 according to the present embodiment.

Here, even when the power receiving device has the configuration that performs communication through the power line communication according to the present embodiment and the configuration that performs communication through the wireless communication according to the present embodiment, the power receiving device according to the second modification of the first embodiment can perform, for example, the processing (1) (determination processing) and the processing (2) (notification control processing).

Therefore, even when the power receiving device has both of the configuration that performs communication through the power line communication according to the present embodiment and the configuration that performs communication through the wireless communication according to the present embodiment, the power receiving device according to the first embodiment can notify the user whether the transmitted power is chargeable power, as in the case where the power receiving device has the configuration illustrated in FIG. 12. Further, even when the power receiving device has both of the configuration that performs communication through the power line communication according to the present embodiment and the configuration that performs communication through the wireless communication according to the present embodiment, the power receiving device according to the first embodiment can improve user convenience, as in the case where the power receiving device has the configuration illustrated in FIG. 12.

Further, when the power receiving device has both of the configuration that performs communication through the power line communication according to the present embodiment and the configuration that performs communication through the wireless communication according to the present embodiment, the power receiving device according to the first embodiment may change the notifying method or the notification content according to a communication path.

[2] Power Receiving Device According to Second Embodiment

Figure 13:
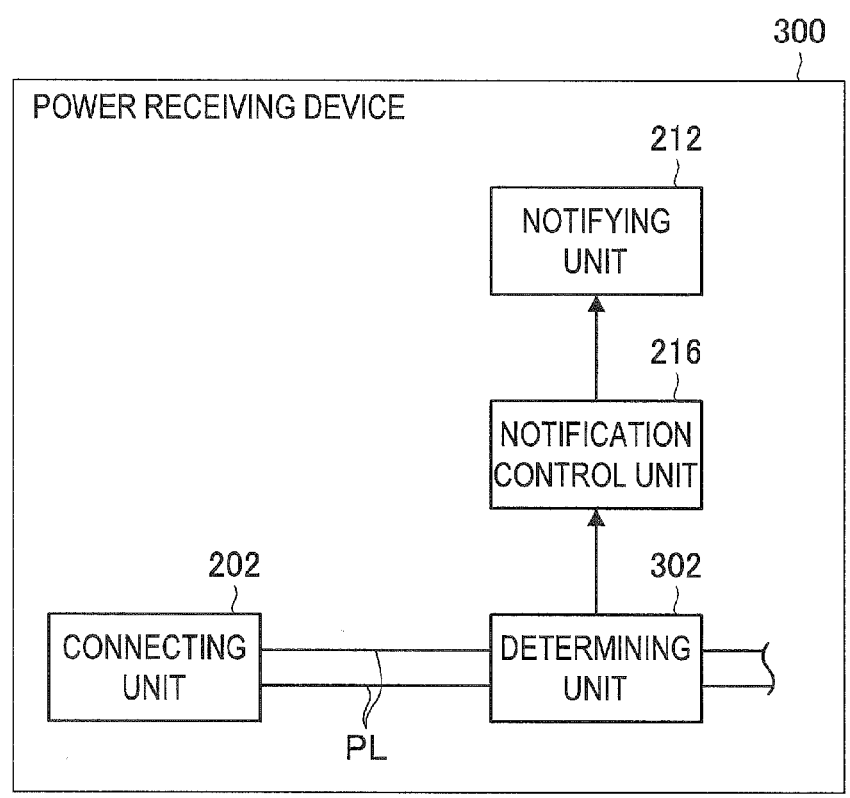
FIG. 13 is an explanatory diagram illustrating an example of a configuration of a power receiving device according to a second embodiment.

The following description will be given of an example of a configuration of the power receiving device according to the second embodiment, which can perform the second determination processing and the notification control processing as the processing related to the notification control method according to the present embodiment. FIG. 13 is an explanatory diagram illustrating an example of a configuration of the power receiving device 300 according to the second embodiment.

The power receiving device 300 includes, for example, a connecting unit 202, a determining unit 302, a notification control unit 216, and a notifying unit 212. Further, for example, the power receiving device 300 includes a battery (not shown) and various kinds of devices (not shown) for implementing the function of the power receiving device 300, which are arranged at the stage subsequent to the determining unit 302 (on the side of the determining unit 302 illustrated in FIG. 13 opposite to the connecting unit 202).

The determining unit 302 actively performs the second determination processing of the processing (1) (determination processing), and determines whether the transmitted power is chargeable, based on the power identification information included in the power transmitted to the power line PL. More specifically, the determining unit 302 is constituted by, for example, an MPU or a packet detector, detects power identification information from the power packet transmitted to the power line PL, and determines whether the transmitted power is chargeable, based on the detected power identification information, as in the case of the determining unit 214 illustrated in FIG. 12 according to the first embodiment.

Further, the determining unit 302 transmits a signal (analog signal/digital signal) indicating the determination result to the notification control unit 216.

The notification control unit 216 is constituted by, for example, an MPU or the like, and actively performs the processing (2) (notification control processing). More specifically, based on the determination result transmitted from the determining unit 302, the notification control unit 216 performs notification based on the determination result, as in the case of the notification control unit 216 illustrated in FIG. 12 according to the first embodiment.

The notifying unit 212 performs notification based on the determination result, as in the case of the notifying unit 212 illustrated in FIG. 12 according to the first embodiment. More specifically, the notifying unit 212, for example, performs notification based on the control signal (or control data) that is transmitted from the notification control unit 216. In addition, the notifying unit 212, for example, performs notification by being driven by power obtained from the power line PL and power obtained from the internal power source such as the battery.

According to the configuration illustrated in FIG. 13, the power receiving device 300 performs the processing related to the notification control method according to the present embodiment (for example, the processing (1) (determination processing) and the processing (2) (notification control processing)). Therefore, according to the configuration illustrated in FIG. 13, the power receiving device 300 can notify the user whether the transmitted power is chargeable power.

Further, the configuration of the power receiving device according to the second embodiment is not limited to the configuration illustrated in FIG. 13. For example, as in the case of the power receiving device according to the first embodiment, the power receiving device according to the second embodiment may include a communication unit (not shown) for performing wired/wireless communication with the external device. In the above configuration, the power receiving device according to the second embodiment can perform the notification to the user based on the determination result such as the warning to the effect that the transmitted power is chargeable, in the external device that performs wired/wireless communication. Further, for example, when the power receiving device according to the second embodiment includes the communication unit (not shown), the power receiving device can be configured not to include the notifying unit 212.

In addition, the power receiving device according to the second embodiment may further include a power supply unit (not shown) that is arranged at the stage subsequent to the determining unit 302 (on the side of the determining unit 302 illustrated in FIG. 13 opposite to the connecting unit 202) to selectively block power transmitted through the power line PL. The power supply unit (not shown), for example, selectively blocks the power transmitted through the power line PL according to the control signal based on the determination result of the processing (1) (determination result), which is transmitted from the determining unit 302, as in the case of the power supply unit (not shown) according to the first embodiment.

In the configuration including the power supply unit (not shown), the processing of the determining unit according to the second embodiment is not limited to the above example. For example, the determining unit according to the second embodiment has an operation mode that performs the control of the power supply unit (not shown), and an operation mode that does not perform the control of the power supply unit (not shown), and may selectively perform the control of the power supply unit (not shown) according to a set operation mode. Further, the setting of the operation mode of the determining unit according to the second embodiment is changed by, for example, a user's operation.

Further, in the power receiving device according to the second embodiment, the determining unit 302 may have the function of the power supply unit (not shown).

The power receiving device according to the second embodiment can perform the processing related to the notification control method according to the present embodiment since the power receiving device has the configuration illustrated in FIG. 13 (or the above-described configuration according to the modification of FIG. 13. The same hereinafter). Therefore, since the power receiving device according to the second embodiment has the configuration illustrated in FIG. 13, the power receiving device can notify the user whether the transmitted power is chargeable power.

Further, since the power receiving device according to the second embodiment notifies the user whether the transmitted power is chargeable, the user can recognize whether the power transmitted to the power receiving device is chargeable power. Therefore, since the power receiving device according to the second embodiment has the configuration illustrated in FIG. 13, the user convenience can be improved.

[3] Power Receiving Device According to Third Embodiment

The configuration of the power receiving device according to the present embodiment is not limited to the configuration according to the first embodiment or the configuration according to the second embodiment. The power receiving device according to the present embodiment, for example, may have a configuration that can perform both of the first determination processing and the second determination processing as the processing (1) (determination processing). More specifically, the power receiving device according to the third embodiment, for example, includes the configuration illustrated in FIG. 12 according to the first embodiment (also including the configuration according to the modification of the first embodiment), and the configuration illustrated in FIG. 13 according to the second embodiment (also including the configuration according to the modification of the second embodiment).

Here, even when the power receiving device has the configuration that can perform both of the first determination processing and the second determination processing as the processing (1) (determination processing), the device according to the third embodiment can perform, for example, the processing (1) (determination processing) and the processing (2) (notification control processing).

Therefore, even when the power receiving device has the configuration that can perform both of the first determination processing and the second determination processing as the processing (1) (determination processing), the power receiving device according to the third embodiment can notify the user whether the transmitted power is chargeable power, as in the case of having the configuration illustrated in FIG. 12 or the case of having the configuration illustrated in FIG. 13. Further, even when the power receiving device has the configuration that can perform both of the first determination processing and the second determination processing as the processing (1) (determination processing), the power receiving device according to the third embodiment can improve user convenience, as in the case of having the configuration illustrated in FIG. 12 or the case of having the configuration illustrated in FIG. 13.

The power supply device has been described above as the present embodiment, but the present embodiment is not limited to this example. The present embodiment can be applied to, for example, various apparatuses or equipment, such as public power sources provided in airports or shops, outlets provided in apartments, houses, or buildings, computers such as personal computers (PCs) or servers, power source taps, devices capable of supplying power to electric vehicles or electrical-power-driven apparatuses, display devices, and the like. Further, the present embodiment can be applied to, for example, vehicles such as electric vehicles that undertake the function of the power supply device. Further, the power supply device according to the present embodiment may receive power transmitted from the external connection device. That is, the power supply device according to the present embodiment may undertake the function of the power receiving device.

Further, the power receiving device has been described as the present embodiment, and the present embodiment is not limited to this example. For example, the present embodiment can be applied to various devices driven by electric power such as communication devices such as computers such as PC, mobile phones, or smart phones, video/audio reproducing devices (or video/audio recording/reproducing devices), portable game machines, display devices, television receivers, lighting devices, toasters, and vehicles driven by electric power such as electric vehicles or the like. For example, the present embodiment can be applied to plugs. In addition, the power receiving device according to the present embodiment may transmit electric power to the external connection device. In other words, the power receiving device according to the present embodiment may undertake the function of the power supply device.

(Program According to Present Embodiment)

A program for causing a computer to function as the power receiving device according to the present embodiment (for example, program that can perform the processing related to the notification control method according to the present embodiment, such as the processing (1) (determination processing) and the processing (2) (notification control processing)) is executed on the computer to notify the user whether the transmitted power is chargeable power.

The preferred embodiments of the present disclosure have been described in detail with reference to the appended drawings, whilst the technical scope of the present disclosure is not limited to the above examples. A person skilled in the art may find various alternations and modifications within the scope of the appended claims, and it should be understood that they will naturally come under the technical scope of the present disclosure.

For example, it has been described above that a program (computer program) causing a computer to function as the power supply device according to the present embodiment or the power receiving device according to the present embodiment is provided. However, in the present embodiment, a recording medium recording each program described above or a recording medium recording both programs can be provided as well.

The above-described configuration illustrates an example of the present embodiment, and it should be understood that the above-described configuration belongs to the technical scope of the present disclosure.

Additionally, the present technology may also be configured as below.

(1)
A power receiving device including:
a connecting unit that is connected to a power line through which power is transmitted;
a determining unit that determines whether transmitted power is chargeable, based on power identification information indicating whether the transmitted power is chargeable power; and
a notification control unit that performs notification based on a determination result.

(2)
The power receiving device according to (1), further including:
a communication unit that performs communication with an external connection device that is connected by wire with a power line via the connecting unit,
wherein the determining unit performs determination based on the power identification information that is transmitted from the external connection device.

(3)
The power receiving device according to (2),
wherein the communication unit performs communication with the external connection device by performing a load modulation based on a signal that is transmitted from the external connection device.

(4)
The power receiving device according to (3),
wherein the communication unit includes:
a power line communication unit that performs communication with the external connection device through the power line by performing a load modulation; and
a communication filter that is connected between the power line communication unit and the power line, blocks at least a signal of a frequency of the power, and does not block a high-frequency signal that has a frequency higher than the frequency of the power and is used for communication.

(5)
The power receiving device according to (3),
wherein the communication unit includes:
a communication antenna that receives a carrier wave according to a high-frequency signal that is transmitted from the external connection device and has a frequency higher than a frequency of the power; and
a wireless communication unit that performs communication with the external connection device through the communication antenna by performing a load modulation.

(6)
The power receiving device according to (1),
wherein the determining unit performs determination based on the power identification information included in the transmitted power.

(7)
The power receiving device according to any one of (1) to (6), further including:
a notifying unit that performs notification based on the determination result,
wherein the notification control unit causes the notifying unit to perform notification based on the determination result.

(8)
The power receiving device according to any one of (1) to (7),
wherein the power receiving device is an electrical-power-driven vehicle.

(9)
A program for causing a computer to execute:
a step of determining whether power transmitted through a power line is chargeable, based on power identification information indicating whether the transmitted power is chargeable power; and
a step of performing notification based on a determination result.

REFERENCE SIGNS LIST

100A, 100B power supply device
102, 202 connecting unit
104, 204 wireless communication unit
106 control unit
108, 208 power line communication unit
110, 206 first filter
112, 210 second filter
200, 200A, 200B, 300 power receiving device
212 notifying unit
214, 302 determining unit
216 notification control unit

The invention claimed is:
1. A power receiving device, comprising:
one or more circuits configured to:
connect to a power line through which power is transmitted;
determine that the transmitted power is chargeable, based on power identification information which indicates that the transmitted power is chargeable power;
generate a notification based on a result of the determination;
communicate with an external connection device, that is connected by a wire with the power line, by a first load modulation based on a first signal that is transmitted from the external connection device,
wherein the power identification information is transmitted from the external connection device; and
block at least a second signal of a frequency of the transmitted power, and allow a high-frequency signal that has a frequency higher than the frequency of the transmitted power and is used for the communication.

2. The power receiving device according to claim 1,
wherein the one or more circuits are further configured to:
receive a carrier wave based on the high-frequency signal that is transmitted from the external connection device and has the frequency higher than the frequency of the transmitted power; and
communicate with the external connection device based on a second load modulation.

3. The power receiving device according to claim 1,
wherein the one or more circuits are further configured to determine that the transmitted power is chargeable based on the power identification information included in the transmitted power.

4. The power receiving device according to claim 1,
wherein the one or more circuits are further configured to generate one of a visual notification or an audio notification based on the result of the determination.

5. The power receiving device according to claim 1, wherein the power receiving device is an electrical-power-driven vehicle.

6. A non-transitory computer-readable medium having stored thereon computer-readable instructions, which when executed by a computer, cause the computer to execute operations, the operations comprising:

determining that power transmitted through a power line is chargeable, based on power identification information indicating that the transmitted power is chargeable power;

generating a notification based on a result of the determination;

communicating with an external connection device, that is connected by a wire with the power line, by a load modulation based on a first signal that is transmitted from the external connection device, wherein the power identification information is transmitted from the external connection device; and blocking at least a second signal of a frequency of the transmitted power, and allowing a high-frequency signal that has a frequency higher than the frequency of the transmitted power and is used for the communication.

* * * * *